(12) United States Patent
Takahashi et al.

(10) Patent No.: US 8,227,886 B2
(45) Date of Patent: Jul. 24, 2012

(54) SEMICONDUCTOR DEVICE AND METHOD OF MANUFACTURING SEMICONDUCTOR DEVICE

(75) Inventors: Hidekazu Takahashi, Tochigi (JP); Yohei Monma, Tochigi (JP); Daiki Yamada, Oura (JP); Takahiro Iguchi, Kanuma (JP); Kazuo Nishi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 703 days.

(21) Appl. No.: 12/358,449

(22) Filed: Jan. 23, 2009

(65) Prior Publication Data
US 2009/0194154 A1    Aug. 6, 2009

(30) Foreign Application Priority Data
Feb. 1, 2008    (JP) ................. 2008-022550

(51) Int. Cl.
*H01L 31/09* (2006.01)
(52) U.S. Cl. ......... 257/440; 257/E25.005; 257/E31.001
(58) Field of Classification Search .......... 257/440, 257/E25.005, E31.001
See application file for complete search history.

(56) References Cited

U.S. PATENT DOCUMENTS

| | | | |
|---|---|---|---|
| 5,261,156 A | 11/1993 | Mase et al. | |
| 5,401,330 A | 3/1995 | Saito et al. | |
| 5,483,987 A | 1/1996 | Chaffaut et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,834,327 A | 11/1998 | Yamazaki et al. | |
| 5,910,687 A | 6/1999 | Chen et al. | |
| 6,118,502 A | 9/2000 | Yamazaki et al. | |
| 6,221,751 B1 | 4/2001 | Chen et al. | |
| 6,224,965 B1 | 5/2001 | Haas et al. | |
| 6,362,866 B1 | 3/2002 | Yamazaki et al. | |
| 6,403,221 B1 | 6/2002 | Nakamura et al. | |

(Continued)

FOREIGN PATENT DOCUMENTS
JP    07-014880    1/1995
(Continued)

OTHER PUBLICATIONS
US 7,359,010, 04/2008, Yamazaki et al. (withdrawn)

*Primary Examiner* — Colleen Matthews
(74) *Attorney, Agent, or Firm* — Eric J. Robinson; Robinson Intellectual Property Law Office, P.C.

(57) ABSTRACT

An object is to reduce the breakage of appearance such as a crack, a split and a chip by external stress of a semiconductor device. Another object is that manufacturing yield of a thin semiconductor device increases. The semiconductor device includes a plurality of semiconductor integrated circuits mounted on the interposer. Each of the plurality of semiconductor integrated circuits includes a light transmitting substrate which have a step on the side surface and in which the width of one section of the light transmitting substrate is narrower than that of the other section of the light transmitting substrate when the light transmitting substrate is divided at a plane including the step, a semiconductor element layer including a photoelectric conversion element provided on one surface of the light transmitting substrate, and a chromatic color light transmitting resin layer which covers the other surface of the light transmitting substrate and a part of the side surface. The colors of the chromatic color light transmitting resin layers are different in each of the plurality of semiconductor integrated circuits.

24 Claims, 18 Drawing Sheets

U.S. PATENT DOCUMENTS

| | | |
|---|---|---|
| 6,607,941 B2 | 8/2003 | Prabhu et al. |
| 6,798,030 B1 | 9/2004 | Izumi et al. |
| 6,855,961 B2 | 2/2005 | Maruyama et al. |
| 6,882,012 B2 | 4/2005 | Yamazaki et al. |
| 6,900,873 B2 | 5/2005 | Yamazaki et al. |
| 6,964,915 B2 | 11/2005 | Farnworth et al. |
| 7,033,664 B2 | 4/2006 | Zilber et al. |
| 7,049,178 B2 | 5/2006 | Kim et al. |
| 7,050,138 B1 | 5/2006 | Yamazaki et al. |
| 7,067,395 B2 | 6/2006 | Maruyama et al. |
| 7,214,555 B2 | 5/2007 | Yamazaki et al. |
| 7,271,858 B2 | 9/2007 | Yamazaki et al. |
| 7,316,937 B2 | 1/2008 | Kojima et al. |
| 7,352,044 B2 | 4/2008 | Yamada et al. |
| 7,446,843 B2 | 11/2008 | Yamazaki et al. |
| 7,471,368 B2 | 12/2008 | Yamazaki et al. |
| 7,485,489 B2 | 2/2009 | Bjorbell |
| 7,642,113 B2 | 1/2010 | Kurosawa |
| 7,662,670 B2 | 2/2010 | Noma et al. |
| 7,728,438 B2 | 6/2010 | Kameyama et al. |
| 7,736,958 B2 | 6/2010 | Dozen et al. |
| 7,808,098 B2 | 10/2010 | Sugiyama et al. |
| 7,833,881 B2 | 11/2010 | Farnworth |
| 7,936,062 B2 | 5/2011 | Humpston et al. |
| 7,968,427 B2 | 6/2011 | Sugiyama et al. |
| 2003/0071953 A1 | 4/2003 | Yamazaki et al. |
| 2004/0113283 A1 | 6/2004 | Farnworth et al. |
| 2004/0245530 A1 | 12/2004 | Kameyama et al. |
| 2005/0009298 A1 | 1/2005 | Suzuki et al. |
| 2005/0070038 A1 | 3/2005 | Yamazaki et al. |
| 2005/0121672 A1 | 6/2005 | Yamazaki et al. |
| 2005/0157242 A1 | 7/2005 | Yamazaki et al. |
| 2005/0233122 A1 | 10/2005 | Nishimura et al. |
| 2006/0044300 A1 | 3/2006 | Koyama et al. |
| 2006/0065960 A1 | 3/2006 | Maruyama et al. |
| 2006/0270195 A1 | 11/2006 | Yamada et al. |
| 2007/0026639 A1 | 2/2007 | Noma et al. |
| 2007/0115416 A1 | 5/2007 | Yamazaki et al. |
| 2008/0179611 A1 | 7/2008 | Chitnis et al. |
| 2008/0188022 A1 | 8/2008 | Yamazaki et al. |
| 2009/0001256 A1 | 1/2009 | Yanagisawa et al. |
| 2009/0002532 A1 | 1/2009 | Nishida et al. |
| 2009/0004764 A1 | 1/2009 | Ohnuma et al. |
| 2009/0166896 A1 | 7/2009 | Yamazaki et al. |
| 2009/0174023 A1 | 7/2009 | Takahashi et al. |
| 2009/0183766 A1 | 7/2009 | Takahashi et al. |
| 2009/0267173 A1 | 10/2009 | Takahashi et al. |

FOREIGN PATENT DOCUMENTS

| | | |
|---|---|---|
| JP | 08-250745 | 9/1996 |
| JP | 08-264796 | 10/1996 |
| JP | 10-092980 | 4/1998 |
| JP | 2001-064029 | 3/2001 |
| JP | 2003-255386 | 9/2003 |
| JP | 2007-331983 | 12/2007 |

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method for manufacturing the semiconductor device. The present invention particularly relates to a semiconductor device including a photoelectric conversion device.

2. Description of the Related Art

Sensors which detect visible light having a wavelength range of from 400 nm to 700 nm are referred to as optical sensors or visible light sensors. Applications of the optical sensor or the visible light sensor such as detecting a light signal in order to read information, and detecting brightness of the ambient environment in order to control operation of electronic devices or the like are known.

For example, an optical sensor is used in a mobile phone or a television device so that brightness of a display screen is adjusted according to brightness of the ambient environment of the mobile phone or the television device.

Such a semiconductor device, for example, the optical sensor or the visible light sensor, is formed in such a manner that transistors are formed over a substrate such as glass, a wafer, or the like, and the substrate is cut (divided).

In many cases, a substrate is divided as follows. First, a groove (also referred to as a scribe line) is formed on the surface of the substrate by using a scribing apparatus. Then, the substrate is forced to be divided along the groove by using a cutting apparatus. Alternatively, in the division of the substrate using a laser beam, the substrate is selectively irradiated with a laser beam for being locally heated. Then, the surface of the substrate which is heated is cooled by a refrigerant. Subsequently, a crack is formed by utilizing thermal stress which is generated in the substrate, and thus the substrate is divided (for example, see Patent Document 1: Japanese Published Patent Application No. 2001-64029).

SUMMARY OF THE INVENTION

However, breakage of the semiconductor device is possible due to external stress such as pressure which is applied in the manufacturing step or in the inspection step of the semiconductor device. Occurrence frequency of damage such as a crack, a split, or a chip increases as the substrate becomes thinner and as the strength becomes weakened.

In addition, as a scribing apparatus, a dicer or the like are often used, and a blade of such a dicer or the like (a dicing blade) are worn away after it is used more than once, so that it is necessary to replace it. Since a dicing blade is expensive, reduction in manufacturing cost is difficult.

In view of the above problem, an object is that the breakage of a semiconductor integrated circuit and a semiconductor device such as a crack, a split and a chip due to external stress is reduced. Another object is that a substrate to be provided with a semiconductor integrated circuit is made to be thin. Another object is that manufacturing yield of a thin semiconductor device increases. Yet another object is that manufacturing cost of a thin semiconductor device is reduced.

A large-sized substrate is separated into substrates each having a semiconductor element layer to form a plurality of semiconductor integrated circuits which have a chip form. The semiconductor integrated circuit includes a photoelectric conversion element and a chromatic color light transmitting resin, and the semiconductor integrated circuits each in a chip form are mounted on an interposer. Since the plurality of semiconductor integrated circuits mounted on the interposer can be freely selected, semiconductor integrated circuits including different colors of the chromatic color light transmitting resin layers are mounted on the interposer, and a semiconductor device including a plurality of colors of the semiconductor integrated circuits having a function of a color sensor can be formed.

For example, a semiconductor integrated circuit including a red light transmitting resin, a semiconductor integrated circuit including a green light transmitting resin, and a semiconductor integrated circuit including a blue light transmitting resin are mounted on an interposer. Therefore, a semiconductor device including semiconductor integrated circuits including photoelectric conversion elements which detect three-color lights of red (R), green (G), and blue (B) can be manufactured.

Further, a semiconductor integrated circuit is subjected to an inspection step before being mounted on an interposer, so that only a conforming item can be selected and mounted on the interposer. Thus, yield of a semiconductor device is increased in a manufacturing process. Particularly in the case of a structure in which the semiconductor integrated circuit includes a semiconductor element layer including a complicated structure such as an amplifier circuit, since there is a possibility to generate defects in the semiconductor integrated circuit in a chip form, it is effective if the semiconductor integrated circuit can be inspected for defects before the semiconductor integrated circuit is mounted on the interposer. Moreover, a semiconductor integrated circuit of high quality is selected from conforming items to be mounted on the interposer, so that a semiconductor device of higher quality can be formed.

Further a semiconductor integrated circuit disclosed in this specification has a structure in which a chromatic color light transmitting resin covers at least a surface of a light transmitting substrate which is opposite to a surface on which a semiconductor element layer is formed and a part of the end portion (side surface) of the light transmitting substrate. Thus, the light transmitting resin layer also functions as a shock absorption layer which absorbs external stress such as pressure which is applied in the manufacturing step or in the inspection step, so that damage such as a scratch or a crack of a semiconductor integrated circuit can be reduced, and a semiconductor device with high reliability can be formed.

In the method for dividing a semiconductor integrated circuit, first, a light transmitting substrate is processed to be thin, whereby the time required for dividing and wear-out of a process means such as a dicer used for dividing are reduced. Further, the dividing step is not performed at one time. First, a groove for separating the semiconductor element layers is formed in the light transmitting substrate, and a light transmitting resin layer is formed over the light transmitting substrate provided with the groove. After that, the light transmitting resin layer and the light transmitting substrate are cut along the groove, and divided (separated) into the plurality of semiconductor integrated circuits. The light transmitting resin layer is a coloring layer of chromatic color which functions as at least a color filter, and a transparent light transmitting resin layer may be further stacked thereover as a shock absorption layer.

Chromatic colors are colors except achromatic colors such as black, gray, or white. The coloring layer is formed of a material which only transmits light colored with chromatic color in order to function as the color filter. As chromatic color, red, green, blue, or the like can be used. Alternatively, cyan, magenta, yellow, or the like may also be used.

A semiconductor integrated circuit including a photoelectric conversion element can be mounted on an interposer with a solder or an anisotropic conductive layer. Further, the semiconductor integrated circuit and the interposer are bonded with resin interposed therebetween, whereby fixing intensity is improved, which is preferable.

Thus, one aspect of a semiconductor device disclosed in this specification includes a plurality of semiconductor integrated circuits mounted on an interposer. The plurality of semiconductor integrated circuits include a photoelectric conversion element, a light transmitting substrate which have a step on the side surface and in which the width of one section of the light transmitting substrate is narrower than that of the other section of the light transmitting substrate when the light transmitting substrate is divided at a plane including the step, a semiconductor element layer provided on one other surface of the light transmitting substrate, and a chromatic color light transmitting resin layer which covers the other surface of the light transmitting substrate and a part of the side surface. The plurality of semiconductor integrated circuits include different colors of the chromatic color light transmitting resin layers. Thus, the cross-section of the light transmitting substrate can also be said to have an upside-down T block shape. The end section of the step refers to a portion of an upper portion than the step in the case where the semiconductor element layer is formed on the lower surface of the light transmitting substrate.

If the cross-section of the light transmitting substrate is an upside-down T block shape, the light transmitting resin layer can be provided so as to fill the cut portion of the end portion of the light transmitting substrate portion.

One aspect of a semiconductor device disclosed in this specification includes a plurality of semiconductor integrated circuits mounted on an interposer. Each of the plurality of semiconductor integrated circuits includes a photoelectric conversion element, a light transmitting substrate in which the thickness of an upper section is larger than the thickness of a lower section, that is a stepped trapezoid in the cross-section, a semiconductor element layer provided on one other surface of the light transmitting substrate, and a chromatic color light transmitting resin layer which covers the other surface of the light transmitting substrate and a part of the side surface. The plurality of semiconductor integrated circuits include different colors of the chromatic color light transmitting resin layers. Depending on the shape of a groove, the side surface in the upper section curves to the lower section.

In a cross-section of a trapezoid of the light transmitting substrate, when an upper section of trapezoid curves towards a lower section, coverage of the curve portion with the light transmitting resin layer is good.

When the light transmitting resin layer in contact with the light transmitting substrate is formed of a chromatic color light transmitting resin layer, and when a light transmitting resin layer is further formed over the light transmitting resin layer, there are effects that the light transmitting resin layer functions as a protective layer and improve shock absorption property, and deterioration of the chromatic color resin layer also can be prevented. The thickness of the light transmitting resin layer functioning as the shock absorption layer may be larger than that of the light transmitting resin layer functioning as the coloring layer. By forming a thick light transmitting resin layer functioning as the shock absorption layer, the shock absorption property as the shock absorption layer can be increased. On the other hand, the thickness of the chromatic color light transmitting resin layer is preferably controlled in order to function as the coloring layer (color filter) in consideration of the relation between the concentration of the coloring material to be included and transmissivity of light.

In the above structure, one aspect of the semiconductor device is that the side surface of the light transmitting substrate in contact with the light transmitting resin layer includes a curved surface which spreads toward the bottom. The light transmitting substrate includes the curved surface which spreads toward the bottom, whereby the light transmitting resin layer can be provided so as to cover the curved surface. Further, a lower surface of the light transmitting substrate and a top surface of the light transmitting substrate are quadrangles, and the area of the lower surface is larger than the area of the top surface. In the light transmitting substrate of a semiconductor device of this specification, the surface in contact with a light transmitting resin layer is referred to as an upper surface, and the surface provided with the semiconductor element layer is referred to as a lower surface. If the area of the lower surface of the light transmitting substrate is larger than the area of the upper surface of the light transmitting substrate, the light transmitting resin layer can be formed on the side surface in the region where the lower surface and the upper surface are not overlap so as to surround the light transmitting substrate.

As thus described, the semiconductor device which is disclosed in this specification has a complicated shape, so that top and bottom of the semiconductor device can be easily distinguished. Thus, misidentification even in an automatic operation by a machine can be reduced.

Further, the semiconductor integrated circuit includes a photoelectric conversion element layer which includes an amplifier circuit for amplifying the output of the photoelectric conversion element. The photoelectric conversion element may include a stacked layer structure formed of a p-type semiconductor layer, an i-type semiconductor layer, and an n-type semiconductor layer.

In this specification, an i-type semiconductor corresponds to the semiconductor in which the concentration of an impurity which imparts p-type or n-type conductivity is $1 \times 10^{20}$ $cm^{-3}$ or less; the concentration of oxygen and nitrogen is $1 \times 10^{20}$ $cm^{-3}$ or less; and photoconductivity exceeds dark conductivity by 100 times or more. The i-type semiconductor may be formed of a material which includes an impurity element which belongs to group 13 or group 15 of the periodic table. That is, i-type semiconductor shows weak n-type electric conductivity when an impurity element for controlling valence electrons is not added intentionally. Therefore, an impurity imparting p-type conductivity may be added to an i-type semiconductor layer intentionally or unintentionally at the time of film formation or after the formation.

One aspect of a method for manufacturing a semiconductor device disclosed in this specification includes the following steps: cutting out a first semiconductor integrated circuit including a first chromatic color light transmitting resin layer and a first photoelectric conversion element from a first light transmitting substrate; cutting out a second semiconductor integrated circuit including a second chromatic color light transmitting resin layer and a second photoelectric conversion element from a second light transmitting substrate; cutting out a third semiconductor integrated circuit including a third chromatic color light transmitting resin layer and a third photoelectric conversion element from a third light transmitting substrate; mounting the first semiconductor integrated circuit including the first chromatic color light transmitting resin layer and the first photoelectric conversion element, the second semiconductor integrated circuit including the second chromatic color light transmitting resin layer and the second photoelectric conversion element, and the third semiconductor integrated circuit including the third chromatic color light transmitting resin layer and the third photoelectric conversion element on an interposer. The first chromatic color light transmitting resin layer, the second chromatic color light transmitting resin layer, and the third chromatic color light transmitting resin layer include different coloring materials.

In the above structure, before mounting on the interposer, an inspection step may be performed to the first semiconductor integrated circuit, the second semiconductor integrated circuit, and the third semiconductor integrated circuit. A semiconductor device can be formed by mounting conforming items of the semiconductor integrated circuits which are selected through the inspection step on the interposer.

In the above structure, a semiconductor device is formed as follows: the first semiconductor integrated circuit, the second semiconductor integrated circuit, and the third semiconductor integrated circuit include a plurality of semiconductor element layers over each of the first light transmitting substrate, the second light transmitting substrate, and the third light transmitting substrate; the thickness of the first light transmitting substrate, the second light transmitting substrate, and the third light transmitting substrate is made to be small; a groove is formed between the plurality of semiconductor element layers over the first light transmitting substrate, the second light transmitting substrate, and the third light transmitting substrate; the first chromatic color light transmitting resin layer, the second chromatic color light transmitting resin layer, and the third chromatic color light transmitting resin layer are formed over the first light transmitting substrate, the second light transmitting substrate, and the third light transmitting substrate in each of which the grooves is formed; and the groove of each of the first light transmitting substrate, the second light transmitting substrate, and the third light transmitting substrate, and the first chromatic color light transmitting resin layer, the second chromatic color light transmitting resin layer, and the third chromatic color light transmitting resin layer are cut.

In the case where an alignment marker is formed on the light transmitting substrate when the light transmitting substrate in which a groove is formed and the light transmitting resin layer are cut, precision of a place to be cut can be improved when the light transmitting substrate and the light transmitting resin layer are cut from the light transmitting substrate side by a cutting means such as a dicer.

In either of the step for providing the groove and the step for dividing the light transmitting substrate, a dicer, a scriber, or the like can be used as a cutting tool. A dicer is preferably used. In a step for providing a groove with a dicer and a step for dividing a light transmitting substrate and a semiconductor element layer, dicing blades are used. The edge of the dicing blade used in the step for providing a groove is thicker than that of the dicing blade used in the step for dividing elements. In other words, when cutting traces are compared, the cutting trace in the step for providing a groove is wider than that of the step for dividing elements. The meaning of a cutting trace here is the width of the groove in the case of a groove, and is the width of the region where a light transmitting substrate member is lost between elements before and after dividing in the case of the step for dividing when the light transmitting substrate is fixed (also referred to as the width of a cut surface).

In a step for polishing the light transmitting substrate to reduce the thickness, a glass polishing machine, a glass grinding machine, or the like is used in a suitable combination. Wearing out of a dicing blade can be reduced by this polishing step. In addition, by providing the light transmitting resin layer, generation of a crack in the completed element can be suppressed when a thin light transmitting substrate is handled and divided. Moreover, a scratch and a crack in the case where the semiconductor integrated circuits in a chip form hit each other in handling the semiconductor integrated circuit after division can be reduced, and yield in a visual examination of the semiconductor device can be increased. Furthermore, since the thickness of the light transmitting substrate after division is small, the semiconductor device on which a semiconductor integrated circuit is mounted can be thin.

Since the cutting trace in the step for providing a groove is wider than that in the step for dividing the substrate, the resin layer can be left on an end surface of the light transmitting substrate when the light transmitting substrate is divided in the step for dividing. In other words, the resin layer is formed in the region of the side surface of the light transmitting substrate where a groove used to be formed. On the other hand, the surface on which a semiconductor element layer is formed and the region where the light transmitting substrate is touched to a dicing blade when the dicing blade is used in the dividing step are not covered with the resin layer.

A resin covers a surface of a light transmitting substrate which is opposite to a surface on which a semiconductor element layer is formed and a region of side surface of the light transmitting substrate, whereby generation of a scratch and a crack can be reduced and a semiconductor device can be formed with high yield.

Therefore, a highly reliable semiconductor device which is easy to treat even it is thin can be provided.

Before dividing the light transmitting substrate, the thickness of the light transmitting substrate is made to be small, and the dividing steps is performed in two steps, so that wearing out of a cutting tool when a light transmitting substrate is processed and divided can be reduced. Since the region which is processed by the cutting tool increases as the size of the light transmitting substrate increases and as the size of semiconductor integrated circuits which is divided is reduced, the cutting tool further wears out. Therefore, the invention by which wearing out of the cutting tool can be reduced, which is disclosed in this specification, is particularly beneficial to a large-sized substrate and a smaller semiconductor integrated circuit. Therefore, a semiconductor device can be manufactured at low cost. The thickness of a semiconductor device can be reduced because thickness of the light transmitting substrate is small.

DETAILED DESCRIPTION OF THE INVENTION

Figure 1A:
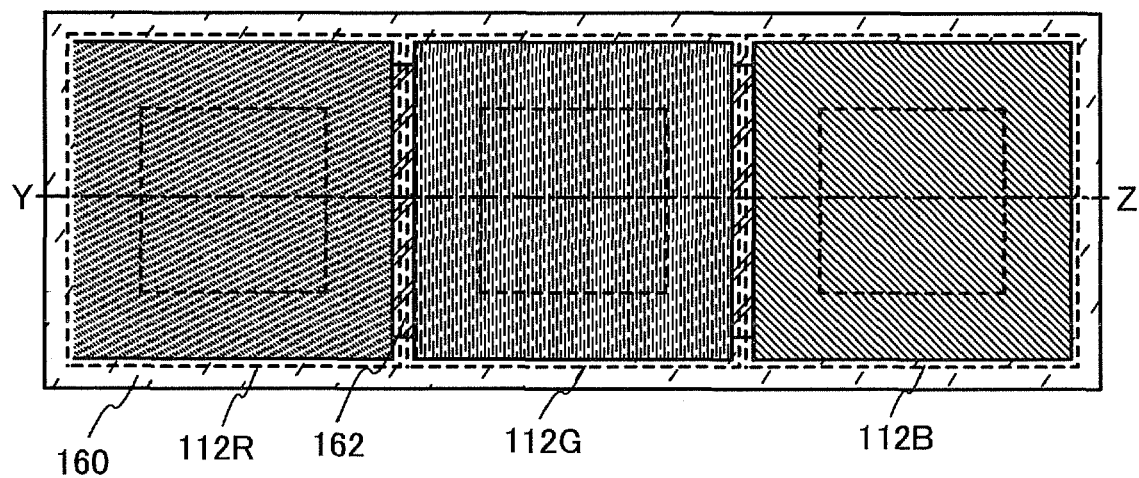
FIGS. 1A and 1B illustrate a semiconductor device.

Embodiment modes will be described in detail with reference to the accompanying drawings. Note that the invention disclosed in this specification is not limited to the following description and it is easily understood by those skilled in the art that the mode and details can be variously changed without departing from the scope and spirit. Therefore, the present invention is to be interpreted without limitation to the following description in embodiment modes. Note that in a structure disclosed in this specification described below, like portions or portions having like functions in different drawings are denoted by the like reference numerals and repeated description thereof is omitted.

Embodiment Mode 1

In this embodiment mode, a semiconductor device for realizing reduction in thickness and size and a method for manufacturing the semiconductor device with high yield are described in detail with reference to FIGS. 1A and 1B, FIGS. 2A and 2B, FIGS. 3A to 3F, FIGS. 4A to 4D, FIGS. 5A to 5D, FIGS. 6A to 6C, FIGS. 7A and 7B, and FIGS. 8A and 8B.

Figure 1B:
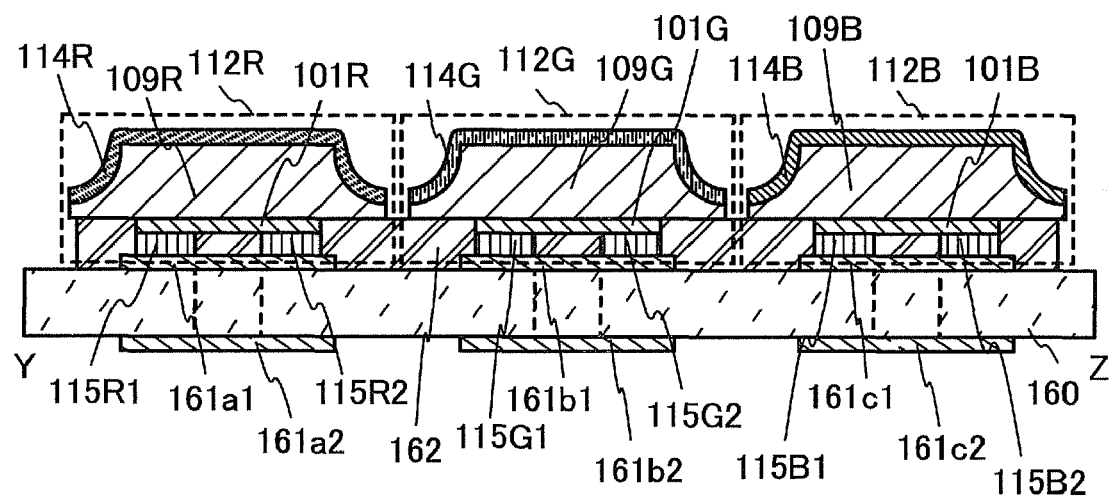

FIGS. 1A and 1B illustrate a semiconductor device of this embodiment mode. FIG. 1A is a plan view of the semiconductor device, and FIG. 1B is a cross-sectional view taken along line Y-Z of FIG. 1A.

The semiconductor device illustrated in FIGS. 1A and 1B has a structure in which a semiconductor integrated circuit 112R, a semiconductor integrated circuit 112G, and a semiconductor integrated circuit 112B are mounted on an interposer 160. The semiconductor integrated circuit 112R, the semiconductor integrated circuit 112G, and the semiconductor integrated circuit 112B are provided with terminal electrodes 115R1, 115R2, 115G1, 115G2, 115B1, and 115B2 which are conductive layers for electrical connection to the outside.

The semiconductor integrated circuit 112R, the semiconductor integrated circuit 112G, and the semiconductor integrated circuit 112B are electrically connected to the interposer 160 through the respective terminal electrodes, electrodes 161a1, 161a2, 161b1, 161b2, 161c1, and 161c2 which are formed on the interposer 160, and an anisotropic conductive layer 162. The interposer 160 includes openings which penetrate from the front face to the rear face as illustrated in FIGS. 1A and 1B with dotted lines, and the electrodes 161a1, 161b1, and 161c1 are continuously in contact with the electrodes 161a2, 161b2, and 161c2 through the openings. Thus, the semiconductor integrated circuit 112R, the semiconductor integrated circuit 112G, and the semiconductor integrated circuit 112B can be mounted on another substrate using the electrodes 161a2, 161b2, and 161c2.

The semiconductor integrated circuit 112R, the semiconductor integrated circuit 112G, and the semiconductor integrated circuit 112B function as color sensors and include light transmitting substrates 109R, 109G, and 109B, semiconductor element layers 101R, 101G, and 101B which include photoelectric conversion elements, and chromatic color light transmitting resin layers 114R, 114G, and 114B which function as color filters, respectively. In this embodiment mode, the semiconductor integrated circuit 112R, the semiconductor integrated circuit 112G, and the semiconductor integrated circuit 112B include a red light transmitting resin layer 114R, a green light transmitting resin layer 114G, and a blue light transmitting resin layer 114B, respectively, and detect light which colored with each of the light transmitting resin layers 114R, 114G, and 114B by passing through. Therefore, a semiconductor device of this embodiment mode including the semiconductor integrated circuit 112R, the semiconductor integrated circuit 112G, and the semiconductor integrated circuit 112B is the semiconductor device which can detect three colors of light (red, green, and blue).

Furthermore, the semiconductor integrated circuit 112R, the semiconductor integrated circuit 112G, and the semiconductor integrated circuit 112B have a structure in which the chromatic color light transmitting resin layers 114R, 114G, and 114B at least cover a surface of the light transmitting substrates 109R, 109G, and 109B which is opposite to a surface on which the semiconductor element layers 101R, 101G, and 101B are formed and a part of the end portions (side surface) of the light transmitting substrates. Thus, the light transmitting resin layers 114R, 114G, and 114B also function as shock absorption layers which absorb external stress such as pressure which is applied in the manufacturing step or in the inspection step, so that generation of damage such as a scratch and a crack of the semiconductor integrated circuits 112R, 112G, and 112B can be reduced and a semiconductor device with high reliability can be formed.

Chromatic colors are colors except achromatic colors such as black, gray, or white. The coloring layer is formed of a material which only transmits light colored with chromatic color in order to function as the color filter. As chromatic color, red, green, blue, or the like can be used. Alternatively, cyan, magenta, yellow, or the like may also be used.

Figure 2A:
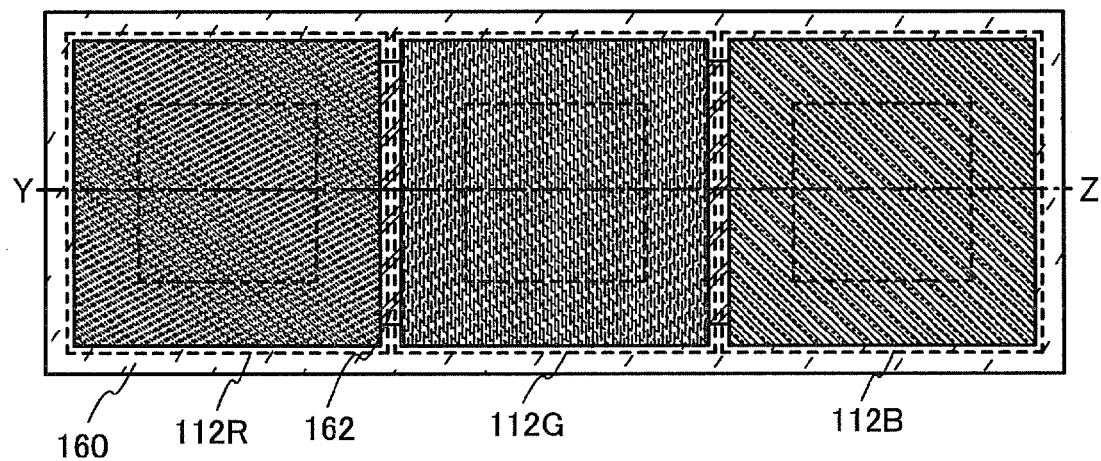
FIGS. 2A and 2B illustrate a semiconductor device.
Figure 2B:
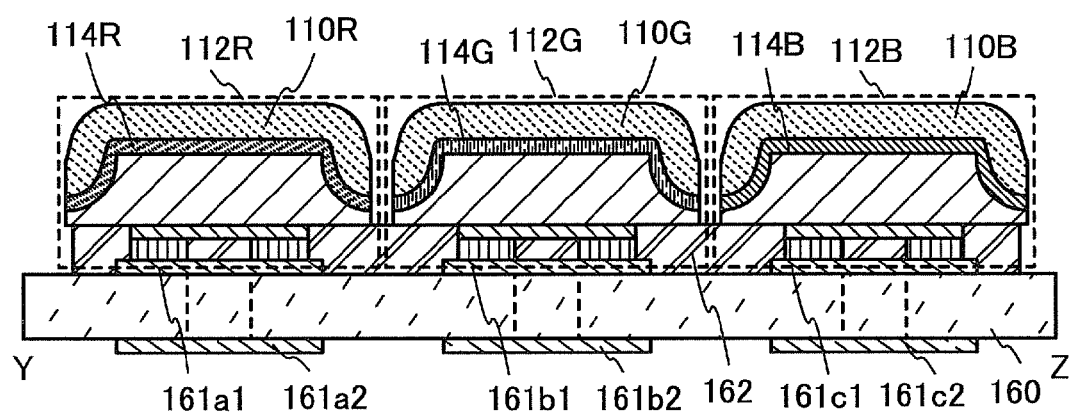
Figure 18A:
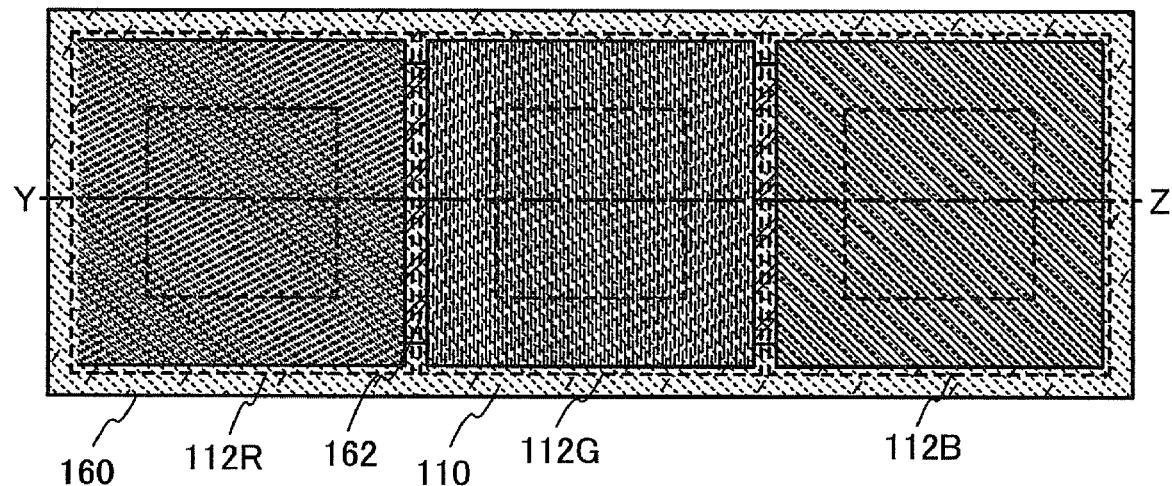
FIGS. 18A and 18B illustrate a semiconductor device.
Figure 18B:
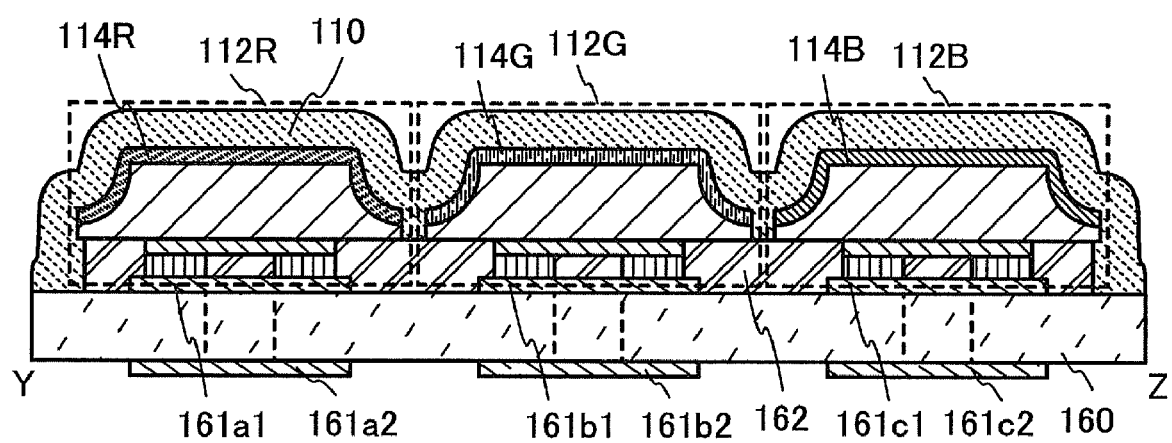

The light transmitting resin layers 114R, 114G, and 114B are chromatic color coloring layers which function as at least color filters, and a transparent light transmitting resin layer may be further stacked thereover as a shock absorption layer. FIGS. 2A and 2B, and FIGS. 18A and 18B illustrate examples in which light transmitting resin layers are stacked in a semiconductor device of FIGS. 1A and 1B. FIG. 2A and FIG. 18A are plan views of semiconductor devices. FIG. 2B is a cross-sectional view taken along line Y-Z of FIG. 2A. FIG. 18B is a cross-sectional view taken along line Y-Z of FIG. 18A.

The semiconductor device of FIGS. 2A and 2B is an example that the semiconductor integrated circuits 112R, 112G, and 112B in which transparent light transmitting resin layers 110R, 110G, and 110B are stacked over the chromatic color light transmitting resin layers 114R, 114G, and 114B, respectively, are mounted on the interposer 160. The chromatic color light transmitting resin layers 114R, 114G, and 114B are formed in contact with the light transmitting substrates. Then, the transparent light transmitting resin layers 110R, 110G, and 110B are stacked over the chromatic color light transmitting resin layers 114R, 114G, and 114B, respectively.

On the other hand, the semiconductor device of FIGS. 18A and 18B is an example that after the semiconductor integrated circuits 112R, 112G, and 112B are mounted on the interposer

160, a transparent light transmitting resin layer 110 is formed over the chromatic color light transmitting resin layers 114R, 114G, and 114B so as to cover the semiconductor integrated circuits 112R, 112G, and 112B. Since the transparent light transmitting resin layer 110 is formed after the semiconductor integrated circuits 112R, 112G, and 112B are mounted on the interposer 160, the transparent light transmitting resin layer 110 can also continuously covers side surfaces of the semiconductor integrated circuits 112R, 112G, and 112B and a connection portion with the interposer 160.

The transparent light transmitting resin layers 110, 110R, 110G, and 110B function as protective layers and are effective in improving shock absorption property and in preventing the chromatic color light transmitting resin layers 114R, 114G, and 114B from deteriorating.

The thickness of the light transmitting resin layers may be 1 μm to 20 μm. When the light transmitting resin layers are stacked, the thickness of the transparent light transmitting resin layers 110, 110R, 110G, and 110B which function as shock absorption layers may be substantially equal to that of the light transmitting resin layers 114R, 114G, and 114B which function as coloring layers (for example, 1.2 μm in thickness) or may be different from the thickness of the light transmitting resin layers 114R, 114G, and 114B which function as coloring layers.

Alternatively, the thickness of the transparent light transmitting resin layers 110, 110R, 110G, and 110B which function as shock absorption layers may be larger than the thickness of the chromatic color light transmitting resin layers 114R, 114G, and 114B which function as coloring layers. The thickness of the transparent light transmitting resin layers 110, 110R, 110G, and 110B which function as shock absorption layers may be large, so that a shock absorption property as the shock absorption layer can be further improved. On the other hand, the chromatic color light transmitting resin layers 114R, 114G, and 114B function as coloring layers (color filter), so that the suitable thickness of the film is preferably controlled as appropriate in consideration of the relation between the concentration of coloring material to be contained and light transmissivity.

For example, when the film thickness of the transparent light transmitting resin layers 110, 110R, 110G, and 110B which function as shock absorption layers is larger than that of the light transmitting resin layers 114R, 114G, and 114B which function as coloring layers, the film thickness of the transparent light transmitting resin layers 110R, 110G, and 110B which function as shock absorption layers may be equal to or more than 5 μm and equal to or less than 10 μm, and the film thickness of the light transmitting resin layers 114R, 114G, and 114B which function as coloring layers may be equal to or more than 0.1 μm and equal to or less than 1 μm.

The side surfaces of the light transmitting substrates 109R, 109G, and 109B are provided with a step. The width of one section of each of the light transmitting substrates 109R, 109G, and 109B is narrower than that of the other section when the light transmitting substrate is divided at a plane including the step. Therefore, the cross-section of the light transmitting substrates 109R, 109G, and 109B can also be said to have an upside-down T block shape. The narrower section refers to an upper portion in the case where the semiconductor element layers 10R, 101G, and 101B are formed on the lower surface of the light transmitting substrates 109R, 109G, and 109B.

If the cross-section of the light transmitting substrate is an upside-down T block shape, the light transmitting resin layer can be provided so as to fill the cut portion of the end portion of the light transmitting substrate portion.

In the semiconductor integrated circuit of this embodiment mode, the side surface of the light transmitting substrate in contact with the light transmitting resin layer includes a curved surface which spreads toward the bottom. The light transmitting substrate includes the curved surface which spreads toward the bottom, whereby the light transmitting resin layer can be provided so as to cover the curved surface. Further, a lower surface of the light transmitting substrate and an upper surface of the light transmitting substrate are quadrangles, and the area of the lower surface is larger than the area of the upper surface. If the area of the lower surface of the light transmitting substrate is larger than the area of the upper surface of the light transmitting substrate, the light transmitting resin layer can be formed on the side surface in the region where the lower surface and the upper surface do not overlap so as to surround of the light transmitting substrate.

A large-sized light transmitting substrate is separated into substrates each with a semiconductor element layer to form the plurality of semiconductor integrated circuits in the chip form. In the method for dividing, first, a substrate is processed to be thin, whereby the time for dividing and wear-out of the process means such as a dicer used for dividing are reduced. Further, the dividing step is not performed at one time. First, a groove for separating the semiconductor element layers is formed in the light transmitting substrate, and a stack of the light transmitting resin layers is formed over the light transmitting substrate provided with the groove. After that, the light transmitting resin layers and the light transmitting substrate are cut along the groove so as to divide (separate) into the plurality of semiconductor integrated circuits.

The cross-section of the light transmitting substrate 109 is a trapezoid with a stepped side surface, and the thickness of the upper section of the stepped trapezoid is larger than that of the lower section of the stepped trapezoid. Depending on the shape of a groove, the side surface in the upper section curves to the lower section as in FIG. 1B.

In the cross-section of the light transmitting substrate which is a trapezoid, if the shape like the trapezoid curves from the upper section to the lower section, coverage of the curve portion with the light transmitting resin layer is good.

As thus described, the semiconductor integrated circuit disclosed in this specification has a complicated shape, so that top and bottom of the semiconductor integrated circuit can be easily distinguished. Thus, misidentification even in an automatic operation by a machine can be reduced.

Figure 17:
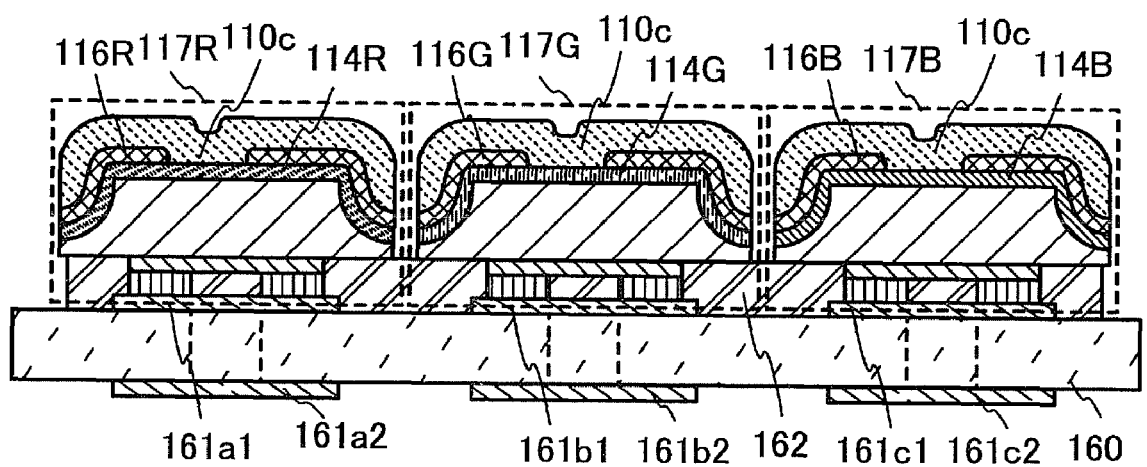
FIG. 17 illustrates a semiconductor device.

Further, a black matrix may be provided. FIG. 17 illustrates a semiconductor device including a light-shielding layer which functions as the black matrix. Semiconductor devices 117R 117G, and 117B in FIG. 17 include light-shielding layers 116R, 116G, and 116B which are formed selectively on the chromatic color light transmitting resin layers 114R, 114G, and 114B which function as color filters. The light-shielding layers 116R, 116G, and 116B can be formed by a coating method such as a spin coating method, or can be formed by a droplet discharge method, a printing method, a dipping method, a dispenser method, a brush painting method, a spray method, a flow coating method, or the like. When a printing method is used, the light-shielding layer can be formed selectively, so that a process step in order to obtain a desired shape such as a photolithography method can be simplified.

The light-shielding layers 116R, 116G, and 116B are formed to have openings corresponding to the regions where photoelectric conversion elements are provided in the semiconductor element layers 101R, 101G and 101B. The light-shielding layers 116R, 116G, and 116B function as the black matrix, and have a function to shield the photoelectric conversion element from external light which is unintentionally delivered in order to prevent malfunction. Therefore, since the photoelectric conversion element can receive only the light which has passed through the opening of the light-shielding layers 116R, 116G, and 116B and the chromatic color light transmitting resin layers 114R, 114G, and 114B which function as color filters, reliability of a semiconductor device improves. Change of characteristics is possible when the semiconductor element which is formed in the semiconductor element layer is irradiated with light; however, providing the light-shielding layer can prevent such a defect.

A method for manufacturing a semiconductor device in this embodiment mode is described below in detail.

Figure 3A:
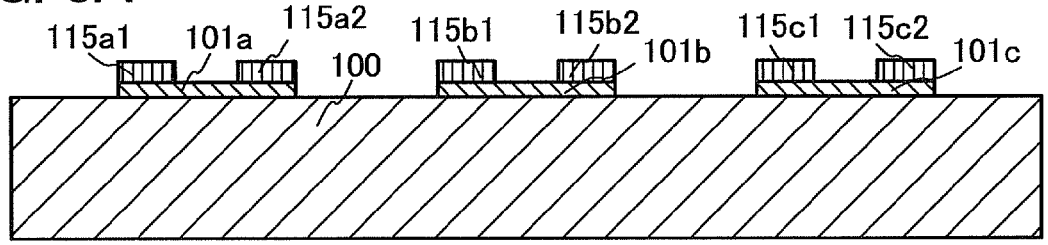
FIGS. 3A to 3F illustrate a method for manufacturing a semiconductor device.
Figure 3B:
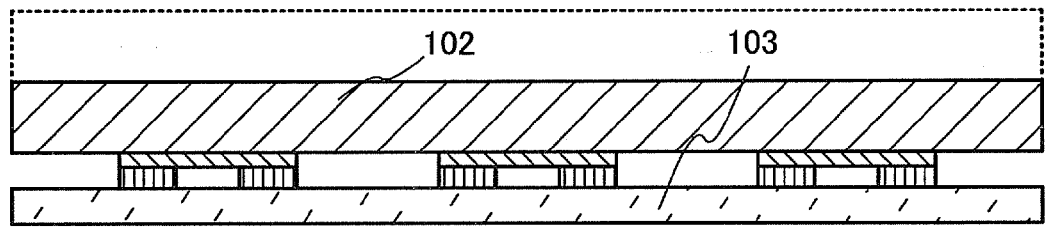
Figure 3C:
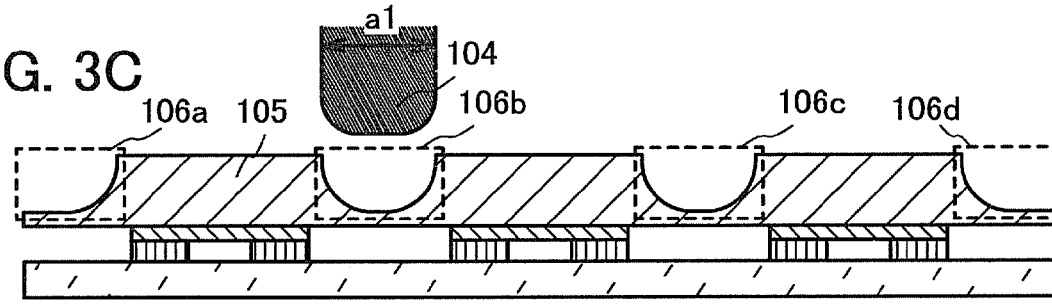

FIG. 3A illustrates semiconductor element layers 101a, 101b, and 101c which are provided over a light transmitting substrate 100 and include a photoelectric conversion element. The semiconductor element layers 101a, 101b, and 101c include terminal electrodes 115a1, 115a2, 115b1, 115b2, 115c1, and 115c2.

Next, a step of reducing the thickness of the light transmitting substrate 100 by grinding treatment and polishing treatment is performed. The side where the semiconductor element layers 101a, 101b, and 101c are formed is made to face a fixing tape 103 for fixing the light transmitting substrate 100 in the step so that the light transmitting substrate 100 is fixed, and the light transmitting substrate 100 is processed into a thinner light transmitting substrate 102 (see FIG. 3B). When the light transmitting substrate 100 is a glass substrate with a thickness of 0.5 mm, the light transmitting substrate 102 is preferably thinned to approximately 0.25 mm to 0.3 mm. By reducing the thickness of the light transmitting substrate, the process time for dividing the light transmitting substrate can be reduced, and wearing out of a processing means such as a dicer used for the division can be reduced. Grinding treatment and polishing treatment can be preferably used in combination. In this embodiment mode, a substrate is ground by a grinder and after that, a surface is planarized with polishing treatment by a polisher. As the polishing treatment, chemical mechanical polishing may be performed.

The plurality of semiconductor integrated circuits with the chip form are taken out by dividing the light transmitting substrate. A dividing step is not performed at one time. First, grooves 106a, 106b, 106c, and 106d for separating the semiconductor element layers 101a, 101b, and 101c are formed in the light transmitting substrate 102 by a dicing blade of a dicer 104 (see FIG. 3C). Below the grooves 106a, 106b, 106c, and 106d in a light transmitting substrate 105, the light transmitting substrate 105 is intentionally left. The thickness of the light transmitting substrate 105 which is left may be approximately 30 μm to 100 μm preferably 30 μm to 50 μm).

Figure 3D:
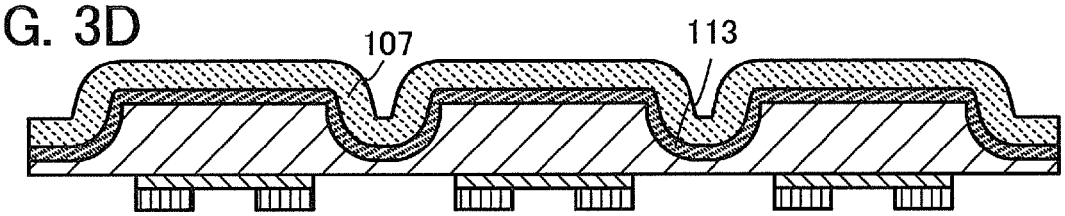
Figure 3E:
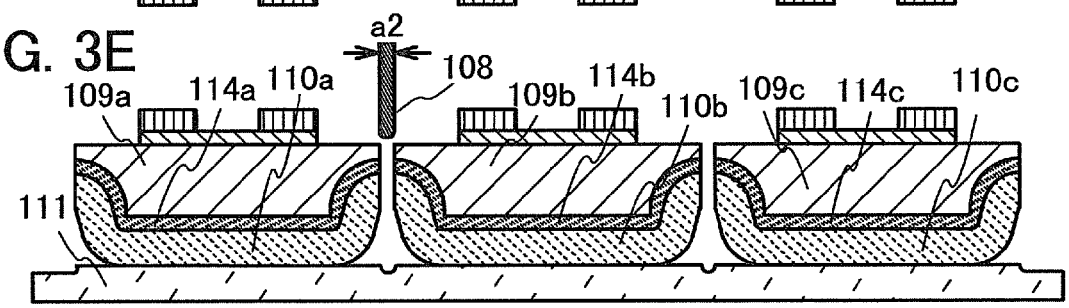

Next, a stacked layer of a light transmitting resin layer 113 and a light transmitting resin layer 107 is formed over the light transmitting substrate 105 in which the grooves 106a, 106b, 106c, and 106d are formed (see FIG. 3D). As a material for the light transmitting resin layers 113 and 107, a resin material which can withstand heat temperature is used when heating treatment is used in a step after the light transmitting resin layer is formed (e.g., at the time of mounting on the interposer). One of the stacked light transmitting resin layers is a chromatic color coloring layer which functions as the color filter, and the other is a resin layer which functions as the shock absorption layer. In this embodiment mode, the light transmitting resin layer 113 is formed including a chromatic color coloring material.

Forming the light transmitting resin layer 107 which functions as a shock absorption layer can give a higher stress resistance to a semiconductor integrated circuit and a semiconductor circuit. For example, even when a pressure of approximately 20 N is applied, a semiconductor integrated circuit provided with the transmitting resin layer which is disclosed in this specification can withstand the pressure without being damaged.

For the light transmitting resin layer, a resin material such as a vinyl resin, an epoxy resin, a phenol resin, a novolac resin, an acrylic resin, a melamine resin, an urethane resin, or a siloxane resin can be used. As a method for forming the resin layer, an application method such as a spin coating method can be used. Alternatively, a droplet discharging method, a printing method, a dipping method, a dispenser method, a brush coating method, a spraying method, a flow coating method, or the like can be used.

After that, the light transmitting resin layers 113 and 107 and the light transmitting substrate 105 are cut along the grooves 106a, 106b, 106c, and 106d so as to be divided (separated) into the plurality of semiconductor integrated circuits. In this embodiment mode, the light transmitting substrate 105 and the light transmitting resin layers 113 and 107 are fixed to a fixing tape 111, and the light transmitting substrate 105 and the light transmitting resin layers 113 and 107 which are left in the grooves 106a, 106b, 106c, and 106d are cut from the light transmitting substrate 105 side by a dicer 108. By the dicer 108, the light transmitting substrate 105 and the light transmitting resin layers 113 and 107 are divided to form light transmitting substrates 109a, 109b, and 109c, and light transmitting resin layers 114a, 114b, 114c, 110a, 110b, and 110c (see FIG. 3E). In this embodiment mode, a dicing tape is used as the fixing tapes 103 and 111.

When the light transmitting substrate 105 in which the grooves are formed and the light transmitting resin layers 113 and 107 are cut, they can be cut from the light transmitting substrate 105 side or the light transmitting resin layers 113 and 107 side. In the case where an alignment marker is formed on the light transmitting substrate 105, precision of a place to be cut can be improved when the light transmitting substrate 105 and the light transmitting resin layers 113 and 107 are cut from the light transmitting substrate 105 side by a cutting means such as a dicer.

Figure 3F:
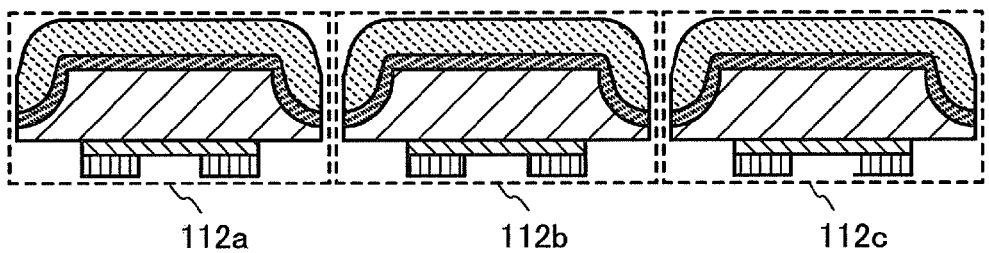

Through the above steps, semiconductor integrated circuits 112a, 112b, and 112c can be formed (see FIG. 3F). The width of a cut surface where the light transmitting resin layers 113 and 107 and the light transmitting substrate 105 are cut is made narrower than the width of the groove, whereby the resin layer formed in the groove can be left on a side surface of the light transmitting substrate. In this embodiment mode, the width of the dicer 104 and the width of the dicer 108 each correspond to the thickness of a dicing blade by which a region to be processed (by the dicer) is determined.

The width of the groove can be controlled by the width $a_1$ of the dicing blade of the dicer 104, and the width of the cut surface can be controlled by the width $a_2$ of the dicing blade of the dicer 108. Accordingly, the width $a_2$ of the dicing blade of the dicer 108 may be made narrower than the width $a_1$ of the dicing blade of the dicer 104. For example, in this embodiment mode, the width $a_1$ of the dicing blade of the dicer 104 is 0.16 mm, and the width $a_2$ of the dicing blade of the dicer 108 is 0.1 mm.

Accordingly, in the semiconductor integrated circuits 112a, 112b, and 112c, surfaces where the semiconductor element layers 101a, 101b, and 101c are not provided and part of side surfaces are covered with the light transmitting resin layers 114a, 114b, 114c, 110a, 110b, and 110c, respectively.

The shape of the groove formed in the light transmitting substrate depends on a processing means. In this embodiment mode, the shape of the grooves 106a, 106b, 106c, and 106d also have a rounded shape (a shape with a curvature) in the cross section of FIG. 1B because of the shape of the slightly rounded dicing blade of the dicer 104. When the shape of the dicing blade is rectangular, the shape of the groove is also rectangular, whereby an end portion of the light transmitting substrate in the semiconductor integrated circuit after the division can also have a rectangular shape.

Figure 9A:
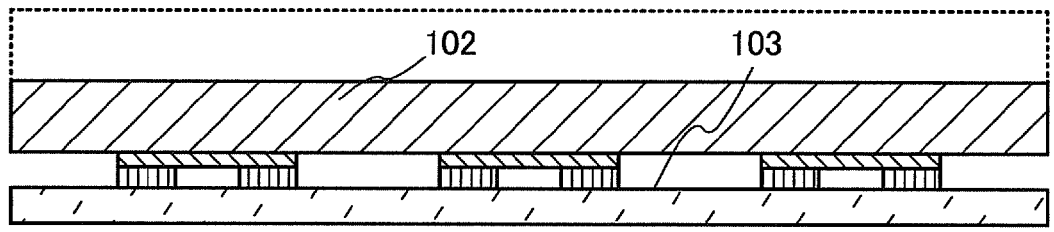
FIGS. 9A to 9F illustrate a method for manufacturing a semiconductor device.

FIGS. 9A to 9F illustrate an example of processing with a rectangular dicing blade. FIG. 9A corresponds to FIG. 3B. The light transmitting substrate 102 provided with the semiconductor element layers 101a, 101b, and 101c is ground and polished over the fixing tape 103.

Figure 9B:
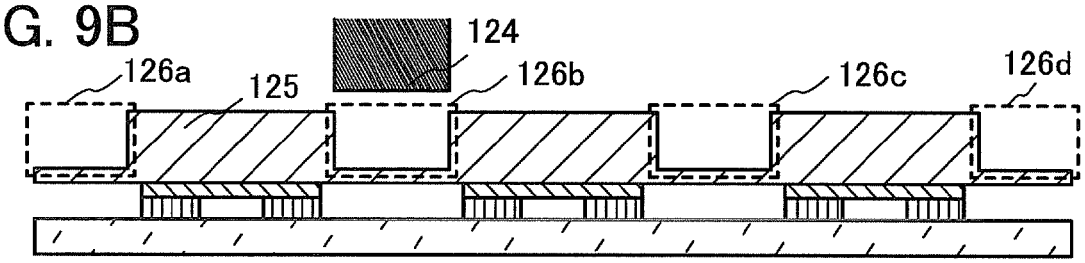

Grooves 126a, 126b, 126c, and 126d for separating the semiconductor element layers 101a, 101b, and 101c are formed in the light transmitting substrate 102 by a dicer 124 (see FIG. 9B). A rectangular dicing blade is used for the dicer 124, so that the grooves 126a, 126b, 126c, and 126d in a light transmitting substrate 125 are rectangular in the cross-sectional view.

Figure 9C:
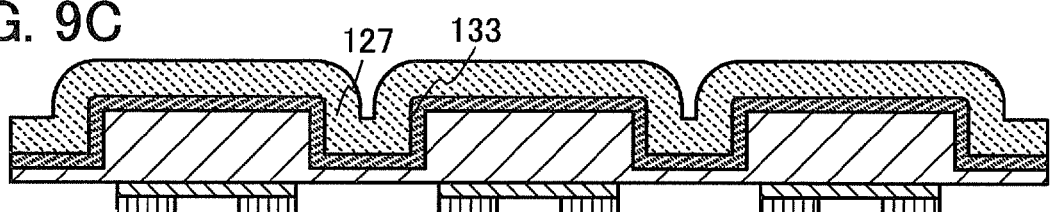
Figure 9D:
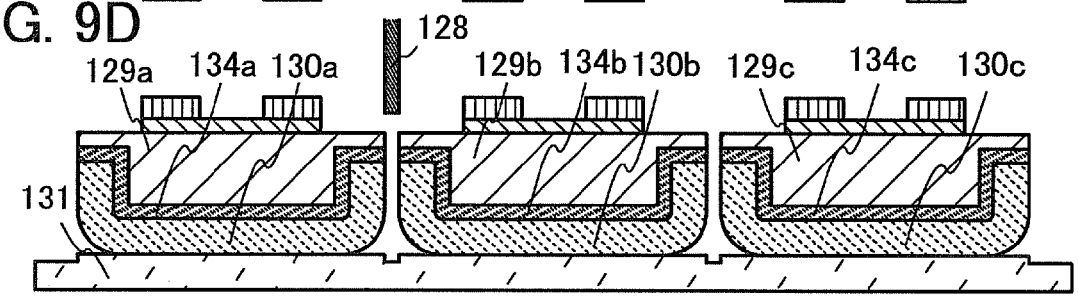

Next, a light transmitting resin layers 133 and 127 are formed over the light transmitting substrate 125 in which the grooves 126a, 126b, 126c, and 126d are formed (see FIG. 9C).

After that, the light transmitting resin layers 133 and 127 and the light transmitting substrate 125 are cut along the grooves 126a, 126b, 126c, and 126d so as to be divided (separated) into the plurality of semiconductor integrated circuits. In this embodiment mode, the light transmitting substrate 125 and the light transmitting resin layers 133 and 127 are fixed to a fixing tape 131, and the light transmitting substrate 125 and the light transmitting resin layers 133 and 127 which are left in the grooves 126a, 126b, 126c, and 126d are cut from the light transmitting substrate 125 side by a dicer 128. By the dicer 128, the light transmitting substrate 125 and the light transmitting resin layers 133 and 127 are divided to be light transmitting substrates 129a, 129b, and 129c and light transmitting resin layers 134a, 134b, 134c, 130a, 130b, and 130c (see FIG. 9D).

Figure 9E:
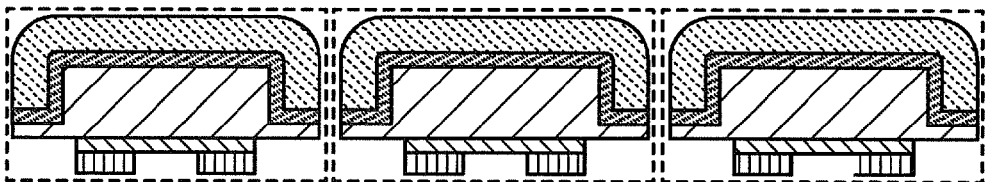

Through the above steps, semiconductor integrated circuits 132a, 132b, and 132c can be formed (see FIG. 9E). The semiconductor integrated circuits 132a, 132b, and 132c have a step on a side surface in the cross-sectional view because of shapes of the rectangular grooves 126a, 126b, 126c, and 126d in the cross section.

Figure 9F:
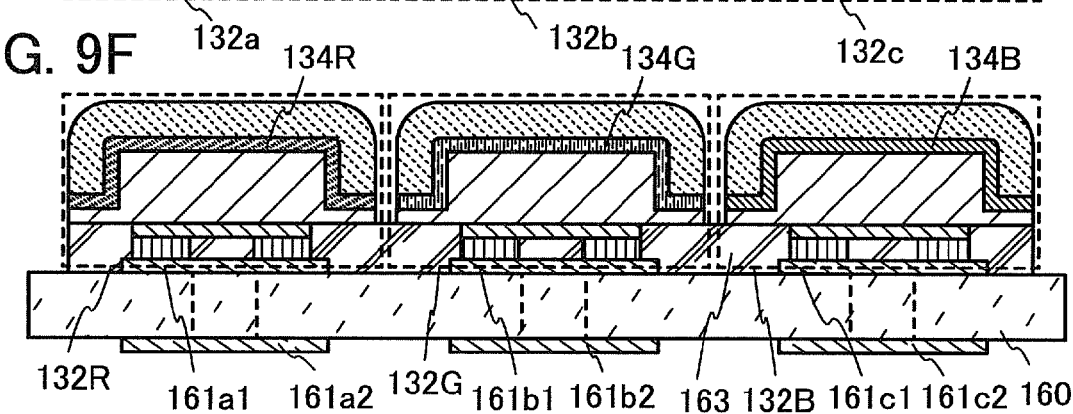

Note that FIG. 9F illustrates an example in which the semiconductor integrated circuit formed in FIGS. 9A to 9F is mounted on the interposer 160 in a manner similar to FIGS. 4A to 4D. In FIG. 9F, semiconductor integrated circuits 132R, 132G and 132B are semiconductor integrated circuits which are formed with substrates, in a manner similar to FIG. 9E. In this embodiment mode, the semiconductor integrated circuit 132R, the semiconductor integrated circuit 132G and the semiconductor integrated circuit 132B include a red light transmitting resin layer 134R, a green light transmitting resin layer 134G, and a blue light transmitting resin layer 134B, respectively, and detect light which colored with each of the light transmitting resin layers 134R, 134G, and 134B by passing through. Note that FIG. 9F illustrates an example in which the semiconductor integrated circuits 132R, 132G, and 132B are mounted on the interposer using the electrodes 161a1, 161b1, and 161c1 of the interposer 160 with a solder, and a resin layer 163 is provided to fix between the semiconductor integrated circuits 132R, 132G, and 132B, and the interposer 160.

Further, in order to increase the coverage at an end portion of the substrate, the light transmitting resin layer is preferably made thicker because the substrate is thicker than the light transmitting resin layer. As illustrated in FIGS. 2A and 2B, the light transmitting resin layer can be made thicker with a stacked structure of the light transmitting resin layers. The shape of a semiconductor integrated circuit to be completed can be freely changed (vary) depending on the structure and the thickness of the light transmitting resin layer or a place to be cut. The light transmitting resin layer is made thicker in FIGS. 2A and B, so that the end portions of the light transmitting substrates are aligned with the end portions of the light transmitting resin layers in each of the semiconductor integrated circuit.

When a dicer with a thin dicing blade is used for division, a large region of the groove in the light transmitting substrate can be left in the completed semiconductor integrated circuit. Stacking the light transmitting resin layers which function as a shock absorption layer can give a higher stress resistance to a semiconductor integrated circuit.

Further, since a groove is formed and a light transmitting resin layer is formed over the groove, a thick light transmitting resin layer can be formed over the lower surface of the groove. Furthermore, after the formation of the light transmitting resin layer, the light transmitting resin layer is stacked over the light transmitting substrate and they are cut, so that the end portions of the light transmitting resin layer are aligned with the end portions of the light transmitting substrate on the side surface. Since the end portions of the upper part of the light transmitting substrate is not exposed on the side surface, breakage and chipping of the end portions of the light transmitting substrate can be prevented. Further, when the light transmitting resin layer is formed thick with stacked layers, the damage to the end portion of the light transmitting substrate can be reduced because the distance between the end portion of the light transmitting substrate and the end portion of the light transmitting resin layer can be made long on the side surface of the semiconductor integrated circuit.

The plurality of semiconductor integrated circuits which are formed over the substrates as illustrated in FIGS. 3A to 3F and divided are mounted on the interposer, and a semiconductor device including the plurality of semiconductor integrated circuits are formed.

Figure 4A:
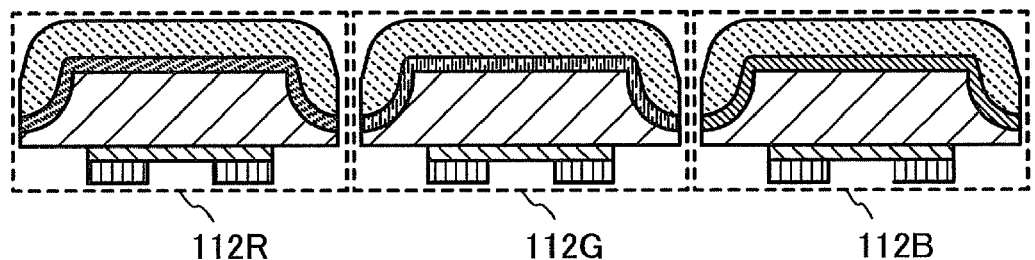
FIGS. 4A to 4D illustrate methods for manufacturing semiconductor devices.

In FIG. 4A, the semiconductor integrated circuits 112R, 112G, and 112B are semiconductor integrated circuits which are formed on the substrates in a manner similar to FIGS. 3A to 3F.

The semiconductor integrated circuit 112R, the semiconductor integrated circuit 112G, and the semiconductor integrated circuit 112B function as color sensors and include the light transmitting substrates 109R, 109G, and 109B, the semiconductor element layers 101R, 101G, and 101B which include photoelectric conversion elements, and the chromatic color light transmitting resin layers 114R, 114G, and 114B which function as color filters, respectively. In this embodiment mode, the semiconductor integrated circuit 112R, the semiconductor integrated circuit 112G, and the semiconductor integrated circuit 112B include a red light transmitting resin layer 114R, a green light transmitting resin layer 114G, and a blue light transmitting resin layer 114B, respectively and detect light which colored with each of the light transmitting resin layers 114R, 114G, and 114B by passing through.

In the semiconductor integrated circuit 112R, the semiconductor integrated circuit 112G, the semiconductor integrated circuit 112B, conductive layers are provided as the terminal electrodes 115R1, 115R2, 115G1, 115G2, 115B1, and 115B2, which make electrical connections on the semiconductor element layer surface when the semiconductor integrated circuits are mounted.

The terminal electrodes 115R1, 115R2, 115G1, 115G2, 115B1, and 115B2 may be formed of conductive resin by a wet process or may be formed of a conductive thin film by a dry process. Alternatively, a conductive resin layer and a conductive thin film may be stacked.

For example, in the case of forming the conductive layer by a screen printing method, the conductive layer can be formed by selectively printing a conductive paste where a conductive particles having a particle size of several nm to several tens µm is dissolved or dispersed in an organic resin. As the conductive particle, a metal particle of one or more metals of silver (Ag), gold (Au), copper (Cu), nickel (Ni), platinum (Pt), palladium (Pd), tantalum (Ta), molybdenum (Mo), titanium (Ti), or the like, or a fine particle of silver halide can be used. As the organic resin included in the conductive paste, one or more selected from organic resins functioning as a binder of metal particles, a solvent, a dispersing agent, and a coating material can be used. Typically, an organic resin such as an epoxy resin, a silicone resin, or the like can be given. Further, in forming the conductive layer, it is preferable to bake the conductive paste after being extruded. Alternatively, a fine particle which includes solder or lead-free solder as its main component may be used.

Figure 4B:
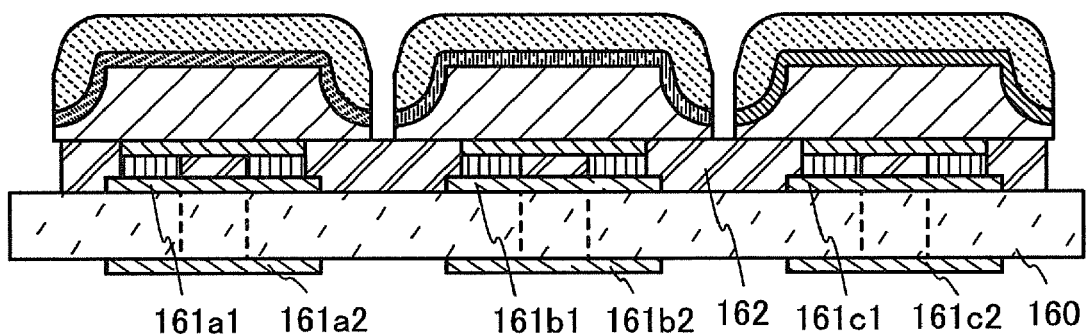

Subsequently, the semiconductor integrated circuit 112R, the semiconductor integrated circuit 112G, and the semiconductor integrated circuit 112B are mounted on the interposer 160 including the electrodes 161a1, 161a2, 161b1, 161b2, 161c1, and 161c2 (see FIG. 4B).

Before the semiconductor integrated circuits are mounted on the interposer, an inspection step may be performed to the semiconductor integrated circuits. A semiconductor device can be manufactured by mounting conforming item of the semiconductor integrated circuits which are selected through the inspection step on the interposer.

The semiconductor integrated circuit including the photoelectric conversion element can be mounted on an interposer with a solder and an anisotropic conductive layer. In this embodiment mode, the anisotropic conductive layer 162 is provided between the semiconductor integrated circuit and the interposer.

Alternatively, as the structure of the connection portion between the semiconductor integrated circuit and the electrodes of the interposer on which the semiconductor integrated circuit is mounted, a wiring over the substrate and a bump which is a conductive projection provided on the terminal electrode of the semiconductor integrated circuit are contacted, and the interposer and the semiconductor integrated circuit may be fixed with the resin interposed therebetween. Alternatively, the resin in which conductive particles are dispersed is provided between the electrode of the interposer and the terminal electrode of the semiconductor integrated circuit. Then, the semiconductor integrated circuit and the electrode of the interposer are connected with the conductive particles and bonded to be fixed with organic resin in which conductive particles are dispersed. As the resin used for bonding, resin such as a photo-curing resin, a heat-curable resin, an air-setting resin, or the like can be used.

Further, providing resin between the semiconductor integrated circuit and the interposer for adhesion is preferable because fixing intensity is improved.

Figure 4C:
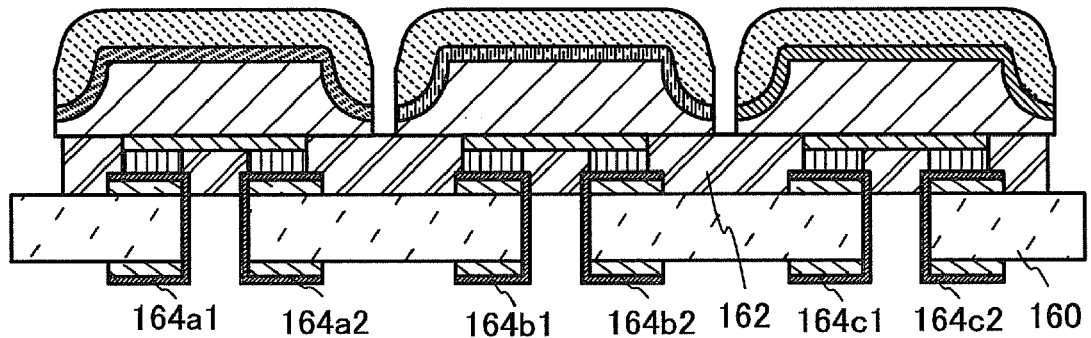
Figure 4D:
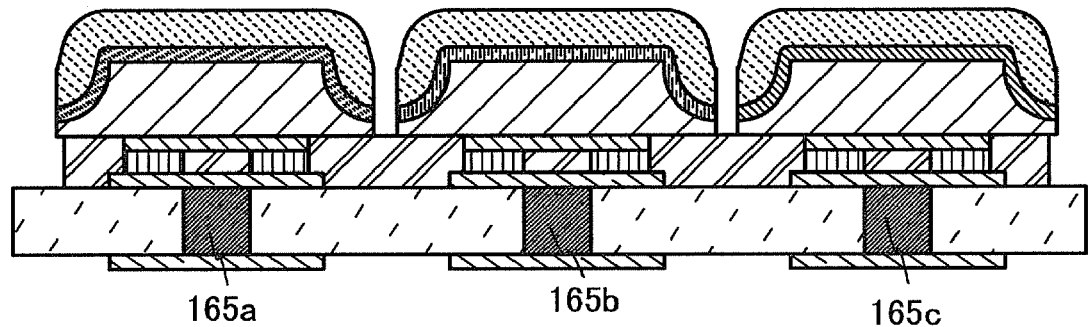

The interposer 160 includes openings which penetrates from the front face to the rear face as illustrated in FIGS. 4A to 4D with dotted lines, and electrodes 161a1, 161b1, and 161c1 are continuously in contact with electrodes 161a2, 161b2, and 161c2 through the openings, respectively. FIGS. 4C and 4D illustrate an example of the structure of the electrode on the interposer.

FIGS. 4C and 4D are the cross-sectional views in which the opening provided in the interposer 160 is separated. In FIG. 4C, conductive films 164a1, 164a2, 164b1, 164b2, 164c1, and 164c2 are formed so as to connect electrodes 161a1 and 161a2, 161b1 and 161b2, and 161c1 and 161c2 which are formed on the front and back of the interposer 160. The conductive films 164a1, 164a2, 164b1, 164b2, 164c1, and 164c2 can be formed by a plating method, or the like. Further, a structure in which resin, a conductive material, or the like fills the opening is preferable. FIG. 4D illustrates an example that the conductive material fills the opening provided in the interposer 160, and electrodes 161a1 and 161a2, 161b1 and 161b2, 161c1 and 161c2 are electrically connected through conductive layers 165a, 165b, and 165c, respectively. Conductive resin or the like can also be used as the conductive material for filling.

Thus, the semiconductor integrated circuit 112R, the semiconductor integrated circuit 112G, and the semiconductor integrated circuit 112B can be mounted on other substrates using the electrodes 161a2, 161b2, and 161c2.

As the interposer, a material such as an organic polymer, an inorganic polymer, kind of glass epoxy, kind of ceramic, polyimide, fluorine resin, or the like can be used.

Thickness of the interposer is approximately in the range of 50 µm to 300 µm (typically, in the range of 100 µm to 200 µm). When a thin interposer is used, the effect of thinning of the semiconductor device can be enhanced. The semiconductor device in FIGS. 1A and 1B is an example in which the thickness of the light transmitting substrates 109R, 109G, and 109B is substantially equal to the thickness of the interposer 160; however, the thickness of the interposer may be larger than that of the light transmitting substrate, or the thickness of the interposer may be smaller than that of the light transmitting substrate.

Further, as illustrated in this embodiment mode, in the semiconductor integrated circuit, the light transmitting resin layer has high heat resistance because it does not expose to the semiconductor element layer side. Thus, generation of defects by performing a thermal treatment when the semiconductor integrated circuit is mounted on the interposer with a solder and an anisotropic conductive layer can be reduced.

The thinned light transmitting substrate in the semiconductor integrated circuit is covered with the light transmitting resin layer, so that the light transmitting semiconductor device is easily handled, whereby the defect such as breakage is not easily generated. Therefore, the high performance semiconductor integrated circuit and the semiconductor device which are thin can be manufactured with high yield.

Since the plurality of semiconductor integrated circuits mounted on the interposer can be freely selected, semiconductor integrated circuits including different chromatic colors of light transmitting resins are mounted on the interposer, and a semiconductor device including a plurality of colors of the semiconductor integrated circuits having a function of a color sensor can be formed.

Further, a semiconductor integrated circuit is subjected to an inspection step before being mounted on an interposer, so that only a conforming item can be selected and mounted on the interposer. Thus, yield of a semiconductor device is increased in a manufacturing process. Particularly in the case of a structure in which the semiconductor integrated circuit includes a semiconductor element layer including a complicated structure such as an amplifier circuit, since there is a possibility to generate defects in the semiconductor integrated circuit in a chip form, it is effective if the semiconductor integrated circuit can be inspected for defects before the semiconductor integrated circuit is mounted on the interposer.

Further a semiconductor integrated circuit disclosed in this specification has a structure in which a chromatic color light transmitting resin covers at least a surface of a light transmitting substrate which is opposite to a surface on which a semiconductor element layer is formed and a part of the end portion (side surface) of the light transmitting substrate. Thus, the light transmitting resin layer also functions as a shock absorption layer which absorbs external stress such as pressure which is applied in the manufacturing step or in the inspection step, so that damage such as a scratch or a crack of a semiconductor integrated circuit can be reduced, and a semiconductor device with high reliability can be formed.

A method for forming a photoelectric conversion element and a field effect transistor on the substrate as a separated semiconductor element layer is described with reference to cross-sectional views of FIGS. 5A to 5D, FIGS. 6A to 6C, and FIGS. 7A and 7B. As a light transmitting substrate 310, AN 100 which is one of glass substrates is used in FIG. 5A. A thin film transistor is used as a field effect transistor formed over the substrate so that a photoelectric conversion element and a thin film transistor can be formed on the substrate in the continuous steps; therefore, there is an advantage that the semiconductor integrated circuits are easily produced in large quantities. Note that a photoelectric conversion element is irradiated with light which pass through a light transmitting resin layer and a light transmitting substrate which function as the color filter.

First, a silicon oxide film containing nitrogen (with a film thickness of 100 nm) to be a base insulating film 312 is formed by a plasma CVD method, and a semiconductor film such as an amorphous silicon film containing hydrogen (with a film thickness of 54 nm) is stacked thereover without being exposed to atmospheric air. Alternatively, the base insulating film 312 may be formed by stacking a silicon oxide film, a silicon nitride film, and a silicon oxide film containing nitrogen. For example, films in which a silicon nitride film containing oxygen with a film thickness of 50 nm and a silicon oxide film containing nitrogen with a film thickness of 100 nm are stacked may be formed as the base insulating film 312. Note that the silicon oxide film containing nitrogen and the silicon nitride film serve as a blocking layer that prevents an impurity such as an alkali metal or the like from diffusing from the glass substrate.

The semiconductor layer included in the semiconductor element can be formed using any of the following materials: an amorphous semiconductor (hereinafter also referred to as an "AS") formed by a chemical vapor deposition method using a semiconductor material gas typified by silane or germane or by a sputtering method; a polycrystalline semiconductor that is formed by crystallizing the amorphous semiconductor by utilizing light energy or thermal energy; a microcrystalline (also referred to as semiamorphous or microcrystal) semiconductor (hereinafter also referred to as a "SAS"); and the like. The semiconductor layer can be formed by a sputtering method, an LPCVD method, a plasma CVD method, or the like.

The microcrystalline semiconductor film belongs to a metastable state of an intermediate between amorphous and single crystalline when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, shifts to the lower wavenumber side than 520 cm$^{-1}$ which represents single crystal silicon. That is, the peak of the Raman spectrum of the microcrystalline silicon exists between 520 cm$^{-1}$ which represents single crystalline silicon and 480 cm$^{-1}$ which represents amorphous silicon. The semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of MHz or a microwave plasma CVD apparatus with a frequency of 1 GHz or more. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1.

As a typical amorphous semiconductor, hydrogenated amorphous silicon can be given while polysilicon or the like can be given as an example of a typical crystalline semiconductor. Examples of polysilicon (polycrystalline silicon) include so-called high-temperature polysilicon that contains polysilicon as a main component and is formed at a process temperature greater than or equal to 800° C., so-called low-temperature polysilicon that contains polysilicon as a main component and is formed at a process temperature less than or equal to 600° C., polysilicon obtained by crystallizing amorphous silicon by using an element that promotes crystallization or the like, and the like. Of course, as described above, a microcrystalline semiconductor or a semiconductor layer which includes a crystalline phase in a part of the layer can also be used.

As a material of the semiconductor, as well as an element of silicon (Si), germanium (Ge), or the like, a compound semiconductor such as GaAs, InP, SiC, ZnSe, GaN, or SiGe can be used. Further, an oxide semiconductor such as zinc oxide (ZnO) or tin oxide ($SnO_2$) can also be used; in the case of using ZnO for the semiconductor layer, the gate insulating layer may be formed of $Y_2O_3$, $Al_2O_3$, $TiO_2$, stacked layers thereof, or the like, and the gate electrode layer, the source electrode layer, and the drain electrode layer may be formed of ITO, Au, Ti, or the like. Further, In, Ga, or the like can be added to ZnO.

In the case of using a crystalline semiconductor film for the semiconductor layer, the crystalline semiconductor film may be formed by various methods (such as a laser crystallization method, a thermal crystallization method, or a thermal crystallization method using an element such as nickel which promotes crystallization). Alternatively, a microcrystalline semiconductor which is a SAS can be crystallized by laser irradiation to improve the crystallinity. When the element that promotes the crystallization is not introduced, prior to irradiating laser light to an amorphous silicon film, the amorphous silicon film is heated at 500° C. for one hour under a nitrogen atmosphere to release hydrogen contained in the amorphous silicon film such that the concentration of hydrogen becomes $1 \times 10^{20}$ atoms/cm$^3$ or less. This is because the amorphous silicon film is destroyed when the amorphous silicon film containing a high amount of hydrogen is irradiated with laser light.

In a crystallization step in which an amorphous semiconductor film is crystallized to form a crystalline semiconductor film, an element which promotes crystallization (also referred to as a catalytic element or a metal element) may be added to the amorphous semiconductor film, and crystallization may be performed by heat treatment (at 550° C. to 750° C. for 3 minutes to 24 hours). As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

Any method can be used for introducing a metal element into the amorphous semiconductor layer as long as the method is capable of making the metal element exist on the surface of or inside the amorphous semiconductor film. For example, a sputtering method, a CVD method, a plasma treatment method (including a plasma CVD method), an adsorption method, or a method for applying a metal salt solution can be employed. In the above mentioned processes, the method using a solution is convenient and has an advantage in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like in order to improve wettability of the surface of the amorphous semiconductor film so that an aqueous solution is spread over the entire surface of the amorphous semiconductor film.

In order to remove or reduce the element which promotes crystallization from the crystalline semiconductor film, a semiconductor film containing an impurity element is formed to be in contact with the crystalline semiconductor film and is made to function as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed over the crystalline semiconductor film containing the element that promotes crystallization, and thermal treatment (at 550 to 750° C. for 3 minutes to 24 hours) is performed. The element which promotes crystallization contained in the crystalline semiconductor film moves into the semiconductor film containing a rare gas element, and thus, the element which promotes crystallization contained in the crystalline semiconductor film is removed or reduced. After that, the semiconductor film containing a rare gas element that has served as a gettering sink is removed.

An amorphous semiconductor film may be crystallized by the combination of thermal treatment and laser light irradiation, or one of thermal treatment and laser light irradiation may be performed a plurality of times.

Further, the crystalline semiconductor film may be directly formed over the substrate by a plasma method. Alternatively, a crystalline semiconductor film may be selectively formed over the substrate by the plasma method.

In this embodiment mode, the polycrystalline silicon film is formed as a semiconductor film by a crystallization method using a catalytic element. A nickel acetate solution containing nickel of 10 ppm by weight is added by a spinner. Note that a nickel element may be dispersed over the entire surface by a sputtering method instead of adding the solution. Next, the semiconductor film is crystallized by heat treatment to form a semiconductor film having a crystalline structure (here, polycrystalline silicon film). Here, a polycrystal silicon film is obtained by a heat treatment for crystallization (at 550° C. for 4 hours) after the heat treatment (at 500° C. for one hour).

Next, an oxide film over the surface of the polycrystal silicon film is removed by a dilute hydrofluoric acid or the like. Then, irradiation of laser light (XeCl: wavelength of 308 nm) for raising a degree of crystallinity and repairing a defect left in a crystal grain is performed in an atmospheric air or in an oxygen atmosphere.

Excimer laser light of a wavelength of 400 nm or less, or the second harmonic or the third harmonic of a YAG laser is used for the laser light. Here, pulsed laser light having a repetition rate of approximately 10 to 1000 Hz is used. The laser light is condensed to 100 to 500 mJ/cm$^2$ by an optical system, and irradiation is performed with an overlap rate of 90 to 95%, whereby a surface of the silicon film may be scanned. In this embodiment mode, irradiation with laser light having a repetition rate of 30 Hz and energy density of 470 mJ/cm$^2$ is performed in the atmosphere.

Note that since the irradiation is conducted in an atmospheric air or in an oxygen atmosphere, an oxide film is formed over the surface by the laser light irradiation. Note that although an example in which the pulsed laser is used is described in this embodiment mode, a continuous wave laser may be used instead. In order to obtain crystal with large grain size at the time of crystallization of a semiconductor film, it is preferable to use a solid laser which is capable of emitting continuous wave and to apply the second to fourth harmonic of a fundamental wave. As a typical example, the second harmonic (532 nm) or the third harmonic (355 nm) of an Nd:YVO$_4$ laser (fundamental wave of 1064 nm) may be applied.

In the case of using a continuous wave laser, laser light emitted from the continuous wave type YVO$_4$ laser of 10 W output is converted into harmonics by using a non-linear optical element. Alternatively, the harmonic may also be emitted by setting YVO$_4$ crystals and a non-linear optical element in a resonator. It is preferable to shape the laser light into rectangular or elliptical shape on the irradiated surface by an optical system to be irradiated to a processing object. The energy density required in this case is approximately 0.01 to 100 MW/cm$^2$ (preferably 0.1 to 10 MW/cm$^2$). Then, the semiconductor film may be moved at a speed of approximately 10 to 2000 cm/s relatively to the laser light so as to be irradiated.

Then, in addition to the oxide film formed by the laser light irradiation, a barrier layer formed of an oxide film having a thickness of 1 to 5 nm in total is formed by treating the surface with ozone water for 120 seconds. This barrier layer is formed to remove a catalytic element added for crystallization, for example nickel (Ni), from the film. Although the barrier layer is formed using ozone water here, the barrier layer may be formed by a method of oxidizing a surface of the semiconductor film having a crystalline structure by UV-ray irradiation in an oxygen atmosphere; a method of oxidizing a surface of the semiconductor film having a crystalline structure by oxygen plasma treatment; by deposition of an oxide film using a plasma CVD method or a sputtering method; an evaporation method; or the like with a thickness of approximately 1 to 10 nm. In addition, before forming the barrier layer, the oxide film formed by laser light irradiation may be removed.

Then, an amorphous silicon film containing an argon element which serves as a gettering site is formed to be 10 nm to 400 nm thick, for example 100 nm thick here, over the barrier layer by sputtering. Here, the amorphous silicon film containing an argon element is formed in an atmosphere containing argon using a silicon target. In the case of using a plasma CVD method, the amorphous silicon film including the argon element is formed under the condition where the flow rate of monosilane and argon ($SiH_4$:Ar) is 1:99, the film-forming pressure is 6.665 Pa, RF power density is 0.087 W/cm$^2$, and the film-forming temperature is 350° C.

Subsequently, a furnace heated to 650° C. is used for a heat treatment for three minutes to remove a catalyst element (gettering). The catalyst element concentration in the semiconductor film having a crystal structure is reduced by this treatment. A lamp annealing apparatus may be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. Note that since nickel is likely to move to the region where the oxygen concentration is high in the gettering process, the barrier layer formed of the oxide film is preferably removed after the gettering.

Note that, in a case where the semiconductor film is not crystallized using a catalytic element, the above steps such as forming the barrier layer, forming the gettering site, heat treatment for gettering, removing the gettering site, and removing the barrier layer are not necessary.

Figure 5A:
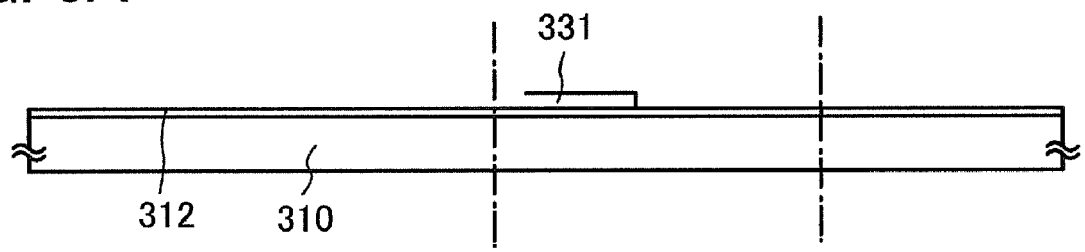
FIGS. 5A to 5D illustrate a method for manufacturing a semiconductor device.

Subsequently, after a thin oxide film is formed on the surface of the obtained semiconductor film having a crystalline structure (for example, a crystalline silicon film) with ozone water, a mask formed of a resist is formed using a first photomask and the semiconductor layer is etched into a desired shape to form island-shaped semiconductor layer 331 (see FIG. 5A). After the semiconductor layer 331 is formed, the mask formed of a resist is removed.

Next, a very small amount of an impurity element (boron or phosphorus) is added in order to control a threshold voltage of a transistor, if necessary. Here, an ion doping method is used, in which diborane ($B_2H_6$) is not separated by mass but excited by plasma.

Next, the oxide film is removed with an etchant containing hydrofluoric acid, and at the same time, the surface of the semiconductor layer 331 is washed. Then, an insulating film which serves as a gate insulating film 313 is formed.

The gate insulating film 313 may be formed of silicon oxide or a stacked structure of silicon oxide and silicon nitride. The gate insulating film 313 may be formed by depositing an insulating film by a plasma CVD method or a low-pressure CVD method, or may be formed by solid-phase oxidation or solid-phase nitridation using plasma treatment. This is because a gate insulating film which is formed using a semiconductor layer that is oxidized or nitrided by plasma treatment is dense and has high withstand voltage and is excellent in reliability. For example, the surface of the semiconductor layer is oxidized or nitrided using nitrous oxide ($N_2O$) diluted with Ar by 1 to 3 times (flow ratio) by application of electric power of microwaves (2.45 GHz) of 3 to 5 kW under a pressure of 10 to 30 Pa. An insulating film of 1 nm to 10 nm (preferably 2 nm to 6 nm) thick is formed by this process. Further, nitrous oxide ($N_2O$) and silane ($SiH_4$) are introduced and electric power of microwaves (2.45 GHz) of 3 to 5 kW is applied under a pressure of 10 to 30 Pa to form a silicon oxynitride film by a chemical vapor deposition method, which is to be a gate insulating film. With a combination of a solid-phase reaction and a reaction by a chemical vapor deposition method, the gate insulating film with low interface state density and excellent withstand voltage can be formed.

Alternatively, as the gate insulating film 313, a high dielectric constant material such as zirconium dioxide, hafnium oxide, titanium dioxide, tantalum pentoxide, or the like may be used. When a high dielectric constant material is used for the gate insulating film 313, gate leakage current can be reduced.

In this embodiment mode, a silicon oxide film containing nitrogen is formed to a thickness of 115 nm by a plasma CVD method as the gate insulating film 313.

Figure 5B:
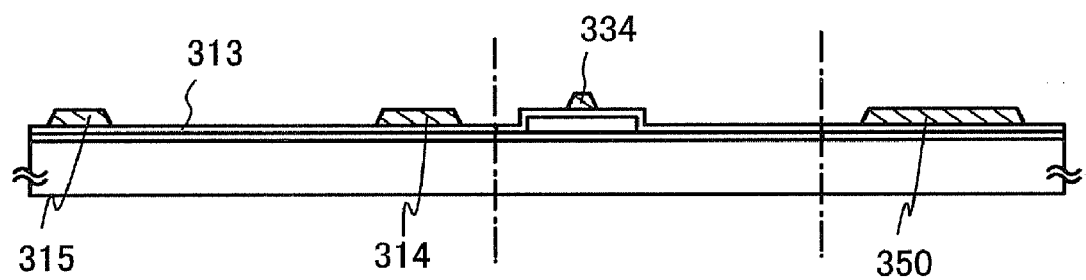

Subsequently, after a metal film is formed over the gate insulating film 313, gate electrode 334, wirings 314 and 315, and a terminal electrode 350 are formed using a second photomask (see FIG. 5B). A stacked-layer film of tantalum nitride with a thickness of 30 nm and tungsten (W) with a thickness of 370 nm is used for the metal film, for example.

Alternatively, as the gate electrodes 334, the wirings 314 and 315, and the terminal electrode 350, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride thereof, for example, titanium nitride, tungsten nitride, tantalum nitride or molybdenum nitride may be used.

Alternatively, a material having light transmitting property for visible light can be used for the gate electrode 334, the wirings 314 and 315, and the terminal electrode 350. As the light transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

Figure 5C:
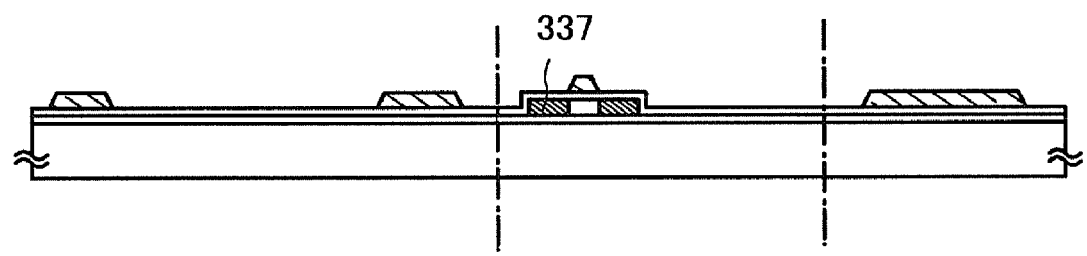

Subsequently, an impurity imparting one conductivity type is introduced into the semiconductor layer 331 to form a source region and a drain region 337 of a transistor 373 (see FIG. 5C). In this embodiment mode, an n-channel transistor is formed; therefore, an impurity imparting n-type conductivity, for example, phosphorus (P), arsenic (As), or the like is introduced into the semiconductor layer 331. When a p-channel transistor is formed, an impurity imparting p-type conductivity, for example, boron (B) may be introduced into the semiconductor layer 331.

Subsequently, after a first interlayer insulating film containing silicon oxide film (not illustrated) is formed to a thickness of 50 nm by CVD, a step for an activation treatment of an impurity element added to each island-like semiconductor region is conducted. The activation step is conducted by rapid thermal annealing (RTA method) using a lamp light source, a method of irradiation of a YAG laser or an excimer laser from the back side, a heat treatment using a furnace, or a method which is a combination of the foregoing methods.

Then, a second interlayer insulating film 316 including a silicon nitride film containing hydrogen and oxygen is formed, for example, to a thickness of 10 nm.

Figure 5D:
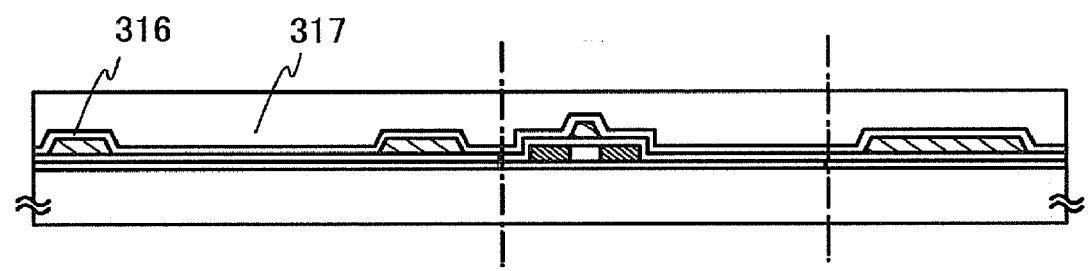

Subsequently, a third interlayer insulating film 317 formed of an insulating material is formed over the second interlayer insulating film 316 (FIG. 5D). An insulating film obtained by a CVD method can be used for the third interlayer insulating film 317. In this embodiment mode, in order to improve adhesion, a silicon oxide film containing nitrogen is formed to a thickness of 900 nm as the third interlayer insulating film 317.

Then, heat treatment (heat treatment at 300 to 550° C. for 1 to 12 hours, for example, at 410° C. for 1 hour in a nitrogen atmosphere) is conducted in order to hydrogenate the semiconductor layer. This step is conducted to terminate dangling bonds in the semiconductor layer caused by hydrogen contained in the second interlayer insulating film 316. The semiconductor layer can be hydrogenated regardless of the existence of the gate insulating film 313.

As the third interlayer insulating film 317, an insulating film using siloxane and a stacked structure thereof can also be used. Siloxane is composed of a skeleton structure of the bond of silicon (Si) and oxygen (O). As a substituent, a compound containing at least hydrogen (for example, an alkyl group or an aryl group) is used. Fluorine may also be used as a substituent. Alternatively, a compound containing at least hydrogen and fluorine may be used as a substituent.

In the case where an insulating film using siloxane or a stacked structure thereof is used as the third interlayer insulating film 317, after the second interlayer insulating film 316 is formed, heat treatment for hydrogenating the semiconductor layer may be conducted, and then, the third interlayer insulating film 317 may be formed.

Subsequently, a mask formed of resist is formed by using a third photomask, and the first interlayer insulating film, the second interlayer insulating film 316, the third interlayer insulating film 317, and the gate insulating film 313 are selectively etched to form a contact hole. The mask formed of resist is then removed.

Note that the third interlayer insulating film 317 may be formed if necessary. In a case where the third interlayer insulating film 317 is not formed, the first interlayer insulating film, the second interlayer insulating film 316, and the gate insulating film 313 are selectively etched to form a contact hole after forming the second interlayer insulating film 316.

Subsequently, after formation of a metal stacked film by a sputtering method, a mask is formed of a resist using a fourth photomask, and then, the metal film is etched selectively to form a wiring 319, a connection electrode 320, a terminal electrode 351, a source electrode or a drain electrode 341 of the transistor 373. The mask formed of resist is then removed. Note that the metal film of this embodiment mode is a stacked-layer film with three films: a Ti film with a thickness of 100 nm, an Al film containing a very small amount of Si with a thickness of 350 nm, and a Ti film with a thickness of 100 nm.

In a case where each of the wiring 319, the connection electrode 320, the terminal electrode 351, and the source electrode or the drain electrode 341 of the transistor 373 is formed of a single layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride may be used. The number of steps of deposition can be reduced in the manufacturing process, by formation of each of the wiring 319, the connection electrode 320, the terminal electrode 351, and the source electrode or the drain electrode 341 of the transistor 373 as a single-layer film.

The top gate transistor 373 using a polycrystalline silicon film as a semiconductor layer can be manufactured through the process described above.

In this embodiment mode, an n-channel transistor is used as an example of the semiconductor element included in the semiconductor element layer; however, a p-channel transistor may also be used. Various forms of field effect transistors can be used, and there is no limitation on the kind of the transistor to be used.

Although description is made of a transistor having a single gate structure in this embodiment mode, a multi-gate structure such as a double-gate structure may also be employed. In this case, gate electrode layers may be provided above and below the semiconductor layer or a plurality of gate electrode layers may be provided only on one side (above or below) of the semiconductor layer.

A transistor or the like formed by an inkjet method or a printing method can be used. Accordingly, transistors can be formed at room temperature, can be formed at a low vacuum, or can be formed using a large substrate. Since the transistor can be manufactured without using a mask (a reticle), a layout of the transistor can be easily changed. Further, since it is not necessary to use a resist, the material cost is reduced and the number of steps can be reduced. Furthermore, since a film is formed only in a necessary portion, a material is not wasted compared with a manufacturing method in which etching is performed after a film is formed over the entire surface, so that the cost can be reduced.

Alternatively, transistors or the like including an organic semiconductor or a carbon nanotube can be used. Accordingly, the transistor can be formed over a substrate that can be bent. Therefore, such transistors can resist a shock.

Alternatively, a transistor may be formed by using a light transmitting substrate which has an SOI structure and uses a single crystal semiconductor layer as a semiconductor layer. Therefore, a small-sized transistor with few variations in characteristics, sizes, shapes, or the like, with high current supply capability can be formed. By using such a transistor, power consumption of a circuit can be reduced or a circuit can be highly integrated.

By forming a field effect transistor using a thin film transistor, the semiconductor device of this embodiment mode can be formed over a light-transmitting substrate such as a glass substrate. Therefore, if a photoelectric conversion element is formed on the top surface of the substrate, the photoelectric conversion element can receive light which pass through the light transmitting substrate from the rear surface of the substrate.

Figure 6A:
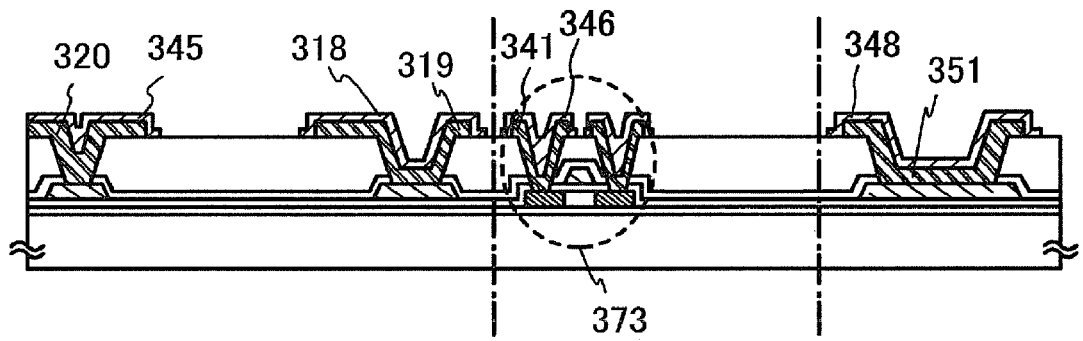
FIGS. 6A to 6C illustrate the method for manufacturing the semiconductor device.

Subsequently, after formation of a conductive metal film (such as titanium (Ti), molybdenum (Mo), or the like) which is not likely to be an alloy due to reacting with a photoelectric conversion layer (typically, amorphous silicon) which is formed later, a mask is formed of a resist using a fifth photomask, and then, a protective electrode 318 which covers the wiring 319, a protective electrode 345, a protective electrode 346, and a protective electrode 348 are formed by etching the conductive metal film selectively (FIG. 6A). Here, a Ti film having a thickness of 200 nm obtained by a sputtering method is used. Note that the connection electrode 320, the terminal electrode 351, and the source electrode or the drain electrode 341 of the transistor 373 are also covered with the conductive metal film. Thus, the conductive metal film also covers a side surface where the Al film which is the second layer in these electrodes is exposed; therefore, the conductive metal film can also prevent diffusion of aluminum atoms to the photoelectric conversion layer.

Note that in a case where each of the wiring 319, the connection electrode 320, the terminal electrode 351, and the source electrode or the drain electrode 341 of the transistor 373 are formed as a single-layer conductive film, the protective electrodes 318, 345, 346, and 348 are not necessarily formed.

Next, a photoelectric conversion layer 371 including a p-type semiconductor layer 371p, an i-type semiconductor layer 371i, and an n-type semiconductor layer 371n is formed over the third interlayer insulating film 317.

The p-type semiconductor layer 371p may be formed by deposition of a semi-amorphous silicon film (also referred to as a microcrystalline silicon film) containing an impurity element belonging to group 13 of the periodic table such as boron (B) by a plasma CVD method.

One example of a method for forming the microcrystalline silicon film is that the microcrystalline silicon film is deposited by glow discharge plasma by mixing a silane gas and hydrogen and/or a rare gas. Silane is diluted with hydrogen and/or a rare gas to be 10 to 2000 times thinner. Therefore, a large amount of hydrogen and/or a rare gas is needed. A temperature for heating the substrate is from 100 to 300° C., preferably from 120 to 220° C. It is preferable that deposition be performed at a temperature of 120 to 220° C. in order that a growing surface of the microcrystalline silicon film is inactivated with hydrogen, and that growth of the microcrystalline silicon is promoted. In the deposition treatment, crystals of a SiH radical, a SiH$_2$ radical, and a SiH$_3$ radical which are active species are grown from the crystal nuclei. Further, an energy band width may be adjusted by mixing germanium hydride or germanium fluoride such as GeH$_4$ or GeF$_4$ into gas such as silane or by adding carbon or germanium to silicon. When carbon is added to silicon, an energy band width becomes wider, and when germanium is added to silicon, an energy band width becomes narrower.

In addition, the protective electrode 318 is in contact with the bottom layer of the photoelectric conversion layer 371, in this embodiment mode, the p-type semiconductor layer 371p.

After the p-type semiconductor layer 371p is formed, the i-type semiconductor layer 371i and the n-type semiconductor layer 371n are sequentially formed. Accordingly, the photoelectric conversion layer 371 including the p-type semiconductor layer 371p, the i-type semiconductor layer 371i, and the n-type semiconductor layer 371n is formed.

As the i-type semiconductor layer 371i, for example, a microcrystalline silicon film may be formed by a plasma CVD method. Note that as the n-type semiconductor layer 371n, a microcrystalline silicon film containing an impurity element belonging to Group 15 of the periodic table, for example, phosphorus (P) may be formed, or after formation of a microcrystalline silicon film, an impurity element belonging to Group 15 of the periodic table may be introduced.

As the p-type semiconductor layer 371p, the i-type semiconductor layer 371i, and the n-type semiconductor layer 371n, an amorphous semiconductor film may be used as well as a microcrystalline semiconductor film. Alternatively, a polycrystalline semiconductor film formed by using the above mentioned catalyst or the above mentioned laser crystallization process may be used.

Further, single crystal silicon formed by Smart Cut may be used.

Figure 6B:
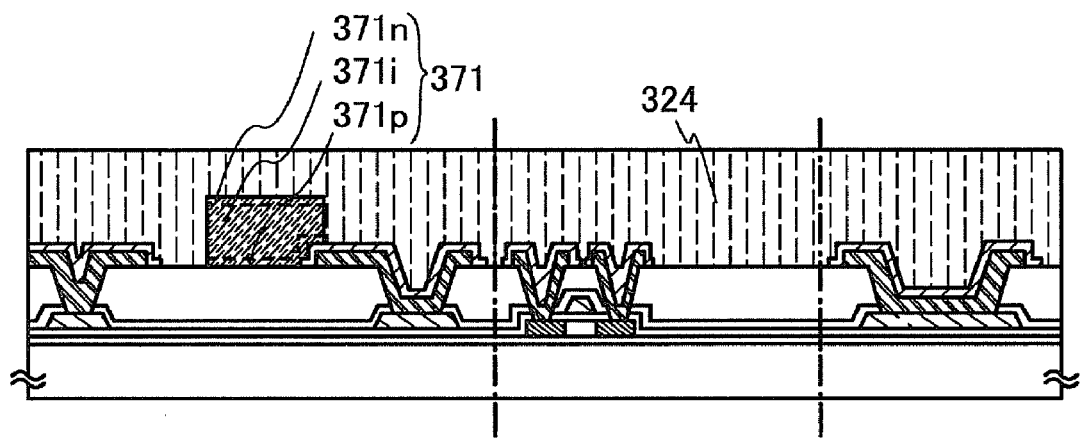
Figure 6C:
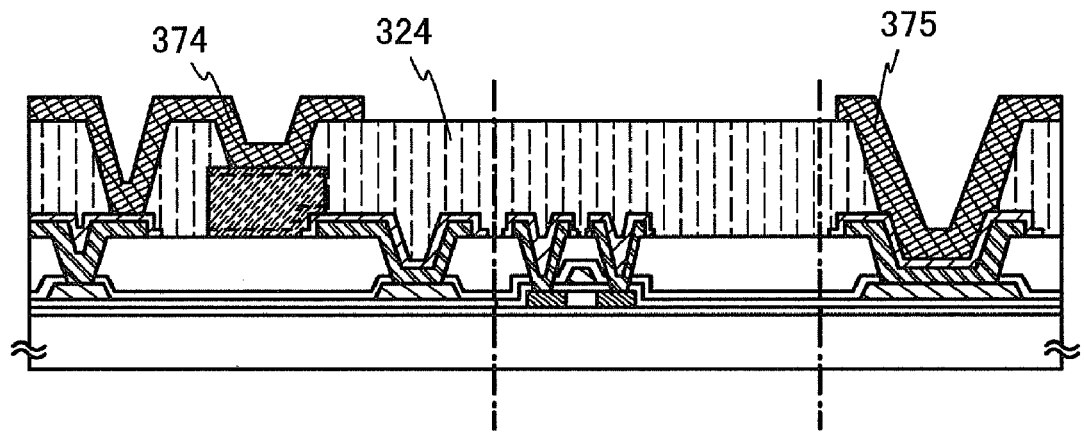

Next, a sealing layer 324 is formed from an insulating material (for example, an inorganic insulating film containing silicon) to have a thickness of 1 to 30 μm over the entire surface to obtain a state illustrated in FIG. 6B. Here, as an insulating material film, a silicon oxide film containing nitrogen with a thickness of 1 μm is formed by a CVD method. By using insulating film formed by CVD method, improvement in adhesion can be achieved.

Subsequently, after the sealing layer 324 is etched to provide openings, wirings 374 and 375 are formed. The wirings 374 and 375 are formed using titanium films (a Ti film) (thickness of 200 nm) which are obtained by a sputtering method.

Subsequently, a protective film 377 is formed to cover an exposed surface. As the protective film 377, a silicon nitride film is used in this embodiment mode. The protective film 377 makes it possible to prevent mixing of impurities such as moisture and organic matter into the transistor 373 and the photoelectric conversion layer 371.

Subsequently, a sealing film 378 is formed over the protective film 377. The sealing film 378 also has a function for protecting the semiconductor element layer from the external stress. In this embodiment mode, the sealing film 378 is formed to a thickness of 20 μm with photo-sensitive epoxyphenol base resin. Ohmcoat 1012B (made by Namics corporation) which is epoxy-phenol base resin may be used for the sealing film 378.

Subsequently, a region of the protective film where a terminal electrode of the upper layer is electrically connected to the wirings 374 and the wiring 375 of the lower layer is etched, and contact holes are formed.

Subsequently, a stacked layer of a titanium film (a Ti film) (thickness of 150 nm), a nickel film (a Ni film) (thickness of 750 nm), and a gold film (an Au film) (thickness of 50 nm) is formed over the sealing film 378 using nickel (Ni) paste and a sputtering method, for example. The fixing intensity of the terminal electrodes 115a1 and 115a2 as thus obtained exceeds 5 N, which is enough fixing intensity as a terminal electrode.

Figure 7A:
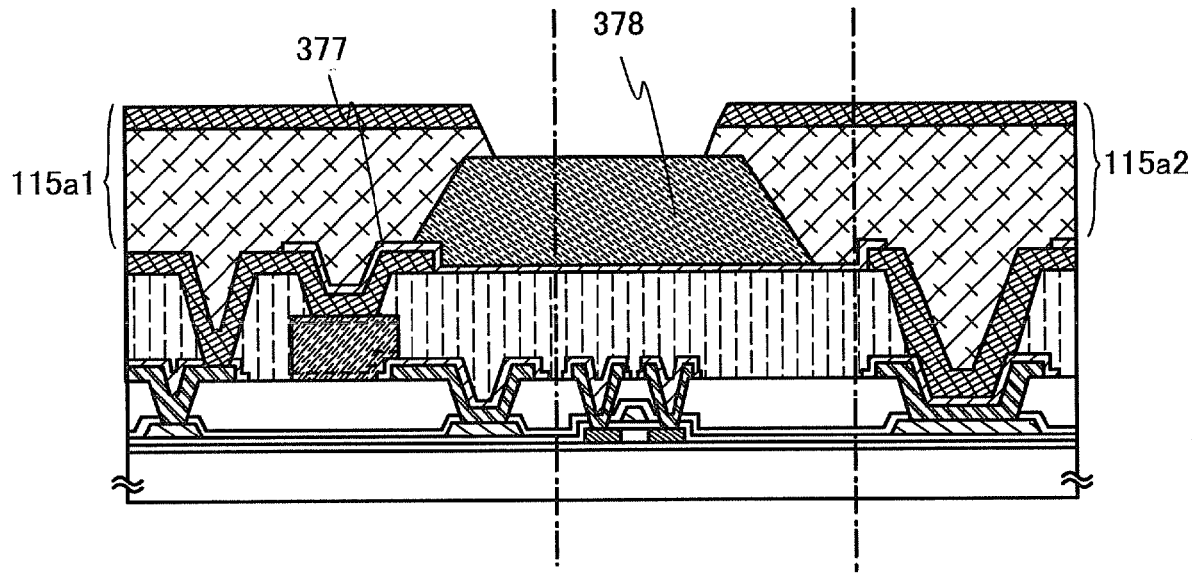
FIGS. 7A and 7B illustrate the method for manufacturing the semiconductor device.

Through the steps described above, the terminal electrodes 115a1 and 115a2 which can be connected by a solder are formed, and a structure illustrated in FIG. 7A can be obtained.

Actually, one semiconductor element layer which includes a photoelectric conversion element, a transistor, and the like shown in FIG. 7A can be mass produced by forming element materials over a large-sized substrate. A large number of semiconductor integrated circuits each includes the semiconductor element layer (e.g., 2 mm×1.5 mm) can be manufactured using one large-sized substrate (e.g., 600 cm×720 cm). The state is illustrated in FIGS. 8A and 8B.

Figure 8A:
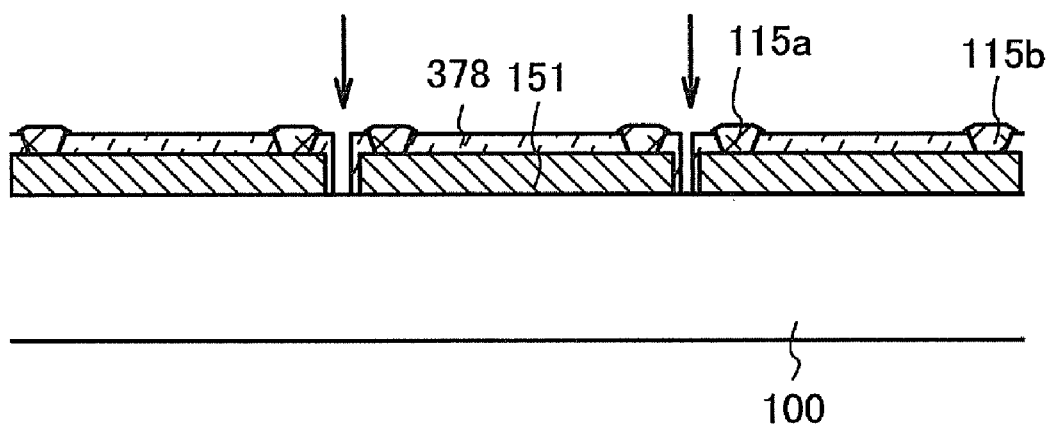
FIGS. 8A and 8B illustrate a method for manufacturing a semiconductor device.
Figure 8B:
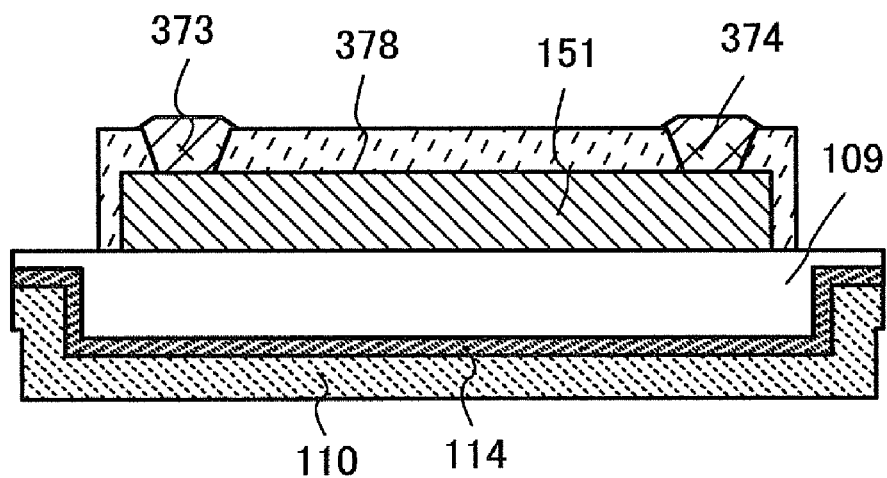

In FIG. 8A, an element layer 151, the sealing film 378, and the terminal electrodes 115a1 and 115a2 are formed over a light transmitting substrate 100. The element layer 151 includes all structures formed between the light transmitting substrate 100 and the sealing film 378 in FIG. 7A.

The light transmitting substrate 100 is divided between the element layers 151 which are adjacently formed, so that a light transmitting substrate 109 having an element is formed.

Figure 7B:
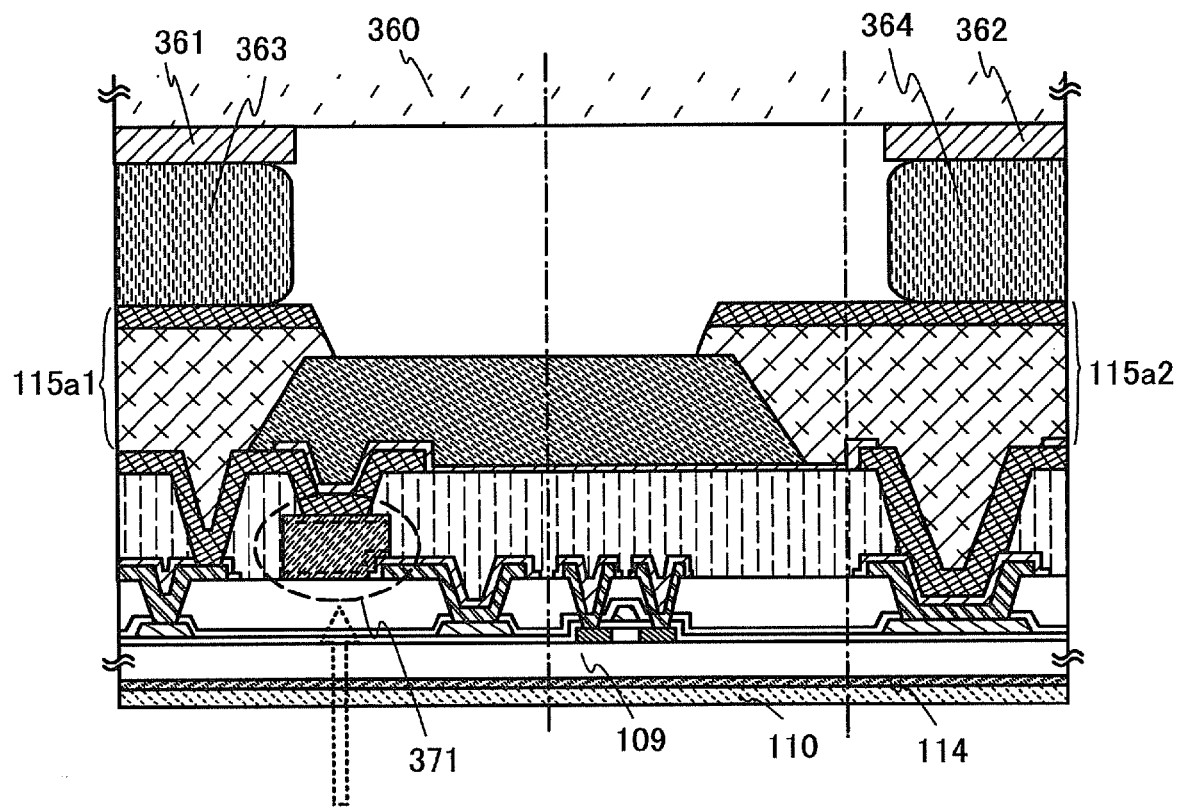

In this way, the light emitting substrate 109 provided with the semiconductor element layer 101 is mounted on the interposer 360 at the terminal electrodes 115a1 and 115a2 with solders 363 and 364 (see FIG. 7B). Note that an electrode 361 on the interposer 360 is mounted on the terminal electrode 115a1 with the solder 363. Further, the electrode 362 on the interposer 360 is mounted on the terminal electrode 115a2 with the solder 364.

In the photoelectric conversion element illustrated in FIG. 7B, light which enters the photoelectric conversion layer 371 can pass from the light emitting substrate 109 and the light transmitting resin layers 110 and 114 side by using the light emitting substrate 109 and the light-transmitting resin layers 110 and 114.

A semiconductor device may be provided in a housing which has an opening in the incident region where light is delivered to the photoelectric conversion element or which has a light transmitting region formed of a light transmitting material. Since the photoelectric conversion element is made to detect light which pass through the chromatic color light transmitting resin layer, light from the external which enters the photoelectric conversion element without passing through the chromatic color light transmitting resin layer can be interrupted by covering the region where the chromatic color light transmitting resin layer is not formed with a housing. Therefore, accuracy of the semiconductor device is improved as a sensor, and discrepancy can be reduced.

The semiconductor device is manufactured through the above described manufacturing process, and thus the semiconductor device can be manufactured with low unit cost and with high yield.

Before dividing the light transmitting substrate, the thickness of the light transmitting substrate is made to be small, and the dividing is performed in two steps, so that wearing out of a cutting tool when a light transmitting substrate is processed and divided can be reduced. Since the region which is processed by the cutting tool increases as the size of the light transmitting substrate increases and as the size of semiconductor integrated circuits which is divided is reduced, the cutting tool further wears out. Therefore, the invention by which wearing out of the cutting tool can be reduced, which is disclosed in this specification, is particularly beneficial to a large-sized substrate and a smaller semiconductor integrated circuit. Therefore, a semiconductor integrated circuit and a semiconductor device can be manufactured at low cost. The thickness of a semiconductor integrated circuit and a semiconductor device can be reduced because thickness of the light transmitting substrate is small.

Therefore, a highly reliable semiconductor device which is easy to treat even it is thin can be provided.

Embodiment Mode 2

For a semiconductor device disclosed in this specification, various forms of field effect transistors can be used as a semiconductor element included in the semiconductor element layer. In this embodiment mode, a field effect transistor including a single crystal semiconductor layer is described in detail as a semiconductor element.

A method where a single crystal semiconductor layer made from a single crystal semiconductor substrate is provided over a light transmitting substrate and a semiconductor element included in a semiconductor element layer is formed is described below with reference to FIGS. 15A to 15D and FIGS. 16A to 16C.

Figure 15A:
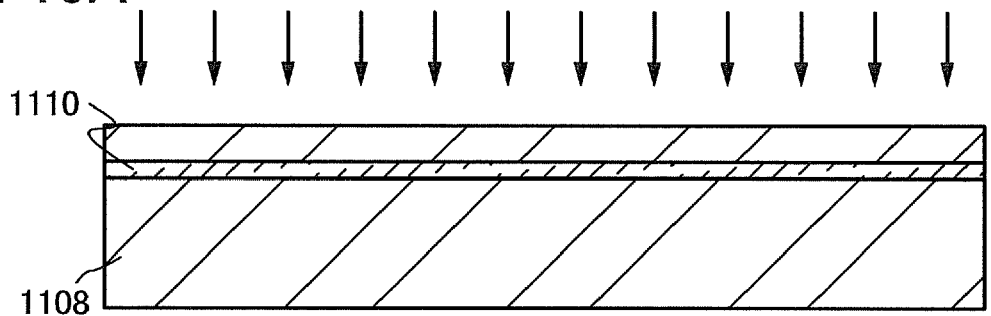
FIGS. 15A to 15D illustrate a method for manufacturing a semiconductor device.

A single crystal semiconductor substrate 1108 illustrated in FIG. 15A is cleaned, and is irradiated with ions accelerated by an electric field to reach a predetermined depth from the surface to form an embrittlement layer 1110. Ion irradiation is performed in consideration of the thickness of a single crystal semiconductor layer which is to be transferred to a light transmitting substrate. Accelerating voltage in irradiation of the ions is set in consideration of such a thickness, so that the single crystal semiconductor substrate 1108 is irradiated with the ions. In this specification, a region which is embrittled by irradiating a single crystal semiconductor substrate with ions so that the region includes microvoids due to the ions is referred to as an embrittlement layer.

As the single crystal semiconductor substrate 1108, a commercial single crystal semiconductor substrate can be used. For example, a single crystal semiconductor substrate formed of a group 4 element, such as a single crystal silicon substrate, a single crystal germanium substrate, or a single crystal silicon germanium substrate can be used. Alternatively, a compound semiconductor substrate formed of gallium arsenide, indium phosphide, or the like can be used. As the semiconductor substrate, a polycrystalline semiconductor substrate may be used. It is needless to say that the single crystal semiconductor substrate is not limited to a circular wafer, and single crystal semiconductor substrates with various shapes can be used. For example, a polygonal substrate such as a rectangular substrate, a pentagonal substrate, a hexagonal substrate, or the like can be used. Needless to say, a commercial circular single crystal semiconductor wafer can be used for the single crystal semiconductor substrate. As the circular single crystal semiconductor wafer, a semiconductor wafer of silicon, germanium, or the like; a compound semiconductor wafer of gallium arsenide, indium phosphide, or the like; or the like can be used. Typical examples of the single crystal semiconductor wafer are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter. Moreover, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other appropriate cutting means. Alternatively, a rectangular single crystal semiconductor substrate can be formed in such a way that an ingot for manufacturing a semiconductor substrate before being sliced into a substrate is processed into a rectangular solid so as to have a rectangular cross section and the rectangular solid ingot is sliced. In addition, although there is no particular limitation on the thickness of the single crystal semiconductor substrate, a thick single crystal semiconductor substrate is preferable because many single crystal semiconductor layers can be formed from one piece of thick material wafer, in consideration of reuse of the single crystal semiconductor substrate. The thickness of single crystal silicon wafers circulating in the market conforms to SEMI standards, which specify that, for example, a wafer with a diameter of 6 inches has a thickness of 625 µm, a wafer with a diameter of 8 inches has a thickness of 725 µm, and a wafer with a diameter of 12 inches has a thickness of 775 µm. Note that the thickness of a wafer conforming to SEMI standards has a tolerance of ±25 µm. It is needless to say that the thickness of the single crystal semiconductor substrate to be a material is not limited to those of SEMI standards, and the thickness can be adjusted as appropriate when an ingot is sliced. Of course, when the single crystal semiconductor substrate 1108 is reused, the thickness of the reused single crystal semiconductor substrate 1108 becomes smaller than that defined by the SEMI standard. A single crystal semiconductor layer obtained over a light transmitting substrate can be determined by selecting a semiconductor substrate to serve as a base.

Further, the crystal surface orientation of the single crystal semiconductor substrate 1108 may be selected depending on a semiconductor element to be manufactured (a field effect transistor in this embodiment mode). For example, a single crystal semiconductor substrate having a {100} plane, a {110} plane, or the like can be used.

In this embodiment mode, an ion irradiation separation method is used in which hydrogen, helium, or fluorine ions are added by irradiation to reach a predetermined depth of the single crystal semiconductor substrate, and then, heat treatment is performed to separate a single crystal semiconductor layer, which is an outer layer. Alternatively, a method may be employed in which single crystal silicon is epitaxially grown on porous silicon and the porous silicon layer is separated by cleavage with water jetting.

A single crystal silicon substrate is used as the single crystal semiconductor substrate 1108, and the surface thereof is processed with dilute hydrofluoric acid. Accordingly, a native oxide film is removed and contaminant such as dust which is attached to the surface is also removed, whereby the surface of the single crystal semiconductor substrate 1108 is cleaned.

The embrittlement layer 1110 may be formed by irradiating with ions by an ion doping method (abbreviated as an ID method) or an ion implantation method (abbreviated as an II method). The embrittlement layer 1110 is formed by irradiating the substrate with ions of hydrogen, helium, or a halogen typified by fluorine. When the embrittlement layer 1110 is irradiated with fluorine ions as a halogen element, $BF_3$ may be used as a source gas. Note that ion implantation is a method in which an ionized gas is mass-separated and a semiconductor substrate is irradiated with the ions.

For example, an ionized hydrogen gas is mass-separated by an ion implantation method and only $H^+$ ions (or only $H_2^+$ ions) can be selectively accelerated and a single crystal semiconductor substrate can be irradiated with the ions.

In an ion doping method, without mass separation of an ionized gas, plural kinds of ion species are generated in plasma and accelerated, and then a single crystal semiconductor substrate is irradiated with the accelerated ion species. For example, when the single crystal semiconductor substrate is irradiated with hydrogen ions including $H^+$ ions, $H_2^+$ ions, and $H_3^+$ ions, the proportion of $H_3^+$ ions is typically 50% or more, for example, in general, the proportion of $H_3^+$ ions is 80% and the proportion of other ions ($H_2^+$ ions and $H_3^+$ ions) is 20%. Here, ion doping also refers to irradiation of only $H_3^+$ ions as ion species.

Alternatively, irradiation may be performed with one ion or plural ions formed of the same atoms which have different mass. For example, in the case of irradiation with hydrogen ions, the hydrogen ions preferably include $H^+$ ions, $H_2^+$ ions, and $H_3^+$ ions with a high proportion of $H_3^+$ ions. In the case of hydrogen ion irradiation, when the hydrogen ions include $H^+$ ions, $H_2^+$ ions, and $H_3^+$ ions with a high proportion of $H_3^+$ ions, efficiency in irradiation can be increased and irradiation time can be shortened. With this structure, separation can be performed easily.

An ion doping method and an ion implantation method are described below in detail. In an ion doping apparatus (also referred to as an ID apparatus) used in an ion doping method, a plasma space is large, so that the single crystal semiconductor substrate can be irradiated with a large amount of ions. On the other hand, an ion implantation apparatus (also referred to as an II apparatus) used in an ion implantation method has a characteristic that mass separation is performed on ions extracted from plasma and only specific ion species can be introduced into a semiconductor substrate. In the ion implantation method, processing is usually performed by scanning with a point beam.

As for a plasma generation method, both of the apparatuses create a plasma state by thermoelectrons which are emitted by heating a filament, for example. However, an ion doping method and an ion implantation method differ greatly in the proportion of the hydrogen ion species when the semiconductor substrate is irradiated with hydrogen ions ($H^+$, $H_2^+$, and $H_3^+$) which are generated.

In view of irradiation of a larger amount of $H_3^+$, the ion doping apparatus is preferable to the ion implantation apparatus.

When the single crystal silicon substrate is irradiated with hydrogen ions or halogen ions such as fluorine ions, fluorine which is added knocks out (expels) silicon atoms in a silicon crystal lattice, so that blank portions are created effectively and microvoids are made in the embrittlement layer. In this case, the volume of the microvoids formed in the embrittlement layer is changed by heat treatment at relatively low temperature, and a thin single crystal semiconductor layer can be formed by separation along the embrittlement layer. After the irradiation of fluorine ions, irradiation of hydrogen ions may be performed so that hydrogen is contained in the voids. Since the embrittlement layer which is formed to separate the thin single crystal semiconductor layer from the single crystal semiconductor substrate is separated using the volume change of the microvoids formed in the embrittlement layer, it is preferable to make effective use of fluorine ion action or hydrogen ion action in such a manner.

A protective layer may be formed between the single crystal semiconductor substrate and an insulating layer which is to be bonded to the single crystal semiconductor layer. The protective layer can be formed of a single layer selected from a silicon nitride layer, a silicon oxide layer, a silicon nitride oxide layer, or a silicon oxynitride layer or can have a stacked-layer structure of a plurality of layers. These layers can be formed over the single crystal semiconductor substrate before the embrittlement layer is formed in the single crystal semiconductor substrate. Alternatively, these layers may be formed over the single crystal semiconductor substrate after the embrittlement layer is formed in the single crystal semiconductor substrate.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

It is necessary to perform irradiation of ions under high dose conditions in the formation of the embrittlement layer, and the surface of the single crystal semiconductor substrate 1108 becomes rough in some cases. Accordingly, a protective layer against the ion irradiation, such as a silicon nitride film, a silicon nitride oxide film, or a silicon oxide film may be provided with a thickness of 50 nm to 200 nm on the surface to which irradiation of ions is performed.

For example, a stacked layer of a silicon oxynitride film (a thickness of 5 nm to 300 nm, preferably 30 nm to 150 nm (e.g., 50 nm)) and a silicon nitride oxide film (a thickness of 5 nm to 150 nm, preferably 10 to 100 nm (e.g., 50 nm)) is formed as the protective layer over the single crystal semiconductor substrate 1108 by a plasma CVD method. As an example, a silicon oxynitride film is formed with a thickness of 50 nm over the single crystal semiconductor substrate 1108, and a silicon nitride oxide film is formed with a thickness of 50 nm over the silicon oxynitride film to be stacked. A silicon oxynitride film may be a silicon oxide film formed by a chemical vapor deposition method using an organosilane gas.

Alternatively, the single crystal semiconductor substrate 1108 may be degreased and cleaned, and an oxide film on the surface is removed, and thermal oxidation may be performed. As thermal oxidation, general dry oxidation may be performed, and preferably, oxidation in an oxidizing atmosphere to which halogen is added is performed. For example, heat treatment is performed at a temperature of equal to or greater than 700° C. in an atmosphere containing HCl at 0.5 to 10 volume % (preferably 3 volume %) with respect to oxygen. Thermal oxidation is preferably performed at a temperature of 950° C. to 1100° C. The processing time may be 0.1 to 6 hours, preferably 0.5 to 3.5 hours. The thickness of the oxide film to be formed is 10 nm to 1000 nm (preferably 50 nm to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, dichloroethylene, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by action of chlorine and removed. The heat treatment has an advantageous effect on the case where the surface of the single crystal semiconductor substrate 1108 is subjected to chemical mechanical polishing (CMP). Hydrogen has an effect of compensating a defect at the interface between the single crystal semiconductor substrate 1108 and an insulating layer to be formed so as to reduce local level density at the interface, and the interface between the single crystal semiconductor substrate 1108 and the insulating layer is inactivated to stabilize electric characteristics.

Halogen can be contained in the oxide film formed by this heat treatment. A halogen element is contained at a concentration of $1 \times 10^{17}$ atoms/cm$^3$ to $5 \times 10^{20}$ atoms/cm$^3$, whereby the oxide film can function as a protective layer which captures impurities such as metal to prevent contamination of the single crystal semiconductor substrate 1108.

When the embrittlement layer 1110 is formed, the accelerating voltage and the total number of ions can be adjusted by the thickness of films deposited over the single crystal semiconductor substrate, the thickness of the targeted single crystal semiconductor layer which is separated from the single crystal semiconductor substrate and transferred to a light transmitting substrate, and ion species with which irradiation is performed.

For example, a hydrogen gas is used for a raw material, and irradiation of ions is performed at an accelerating voltage of 40 kV with the total ion number of $2 \times 10^{16}$ ions/cm$^2$ by an ion doping method, so that the embrittlement layer can be formed. If the protective layer is made to be thick and irradiation of ions is performed under the same conditions to form the embrittlement layer, a thin single crystal semiconductor layer can be formed as a targeted single crystal semiconductor layer which is separated from the single crystal semiconductor substrate and transferred (transposed) to the light transmitting substrate. For example, although it depends on the proportion of ion species ($H^+$ ions, $H_2^+$ ions, and $H_3^+$ ions), when the embrittlement layer is formed under the above conditions and a silicon oxynitride film (with a thickness of 50 nm) and a silicon nitride oxide film (with a thickness of 50 nm) are stacked as a protective layer over the single crystal semiconductor substrate, the thickness of the single crystal semiconductor layer to be transferred to the light transmitting substrate is approximately 120 nm. Alternatively, when a silicon oxynitride film (with a thickness of 100 nm) and a silicon nitride oxide film (with a thickness of 50 nm) are stacked as a protective layer over the single crystal semiconductor substrate, the thickness of the single crystal semiconductor layer to be transferred to the light transmitting substrate is approximately 70 nm.

When helium (He) or hydrogen is used for a source gas, irradiation is performed with an accelerating voltage of 10 kV to 200 kV with a dose of $1 \times 10^{16}$ ions/cm$^2$ to $6 \times 10^{16}$ ions/cm$^2$, so that the embrittlement layer can be formed. When helium is used as the source gas, irradiation of $He^+$ ions can be performed as main ions without mass separation. Further, when hydrogen is used as the source gas, irradiation of $H_3^+$ ions and $H_2^+$ ions can be performed as main ions. Ion species are changed depending on a plasma generation method, pressure, the supply quantity of a source gas, or accelerating voltage.

As an example of forming the embrittlement layer, a silicon oxynitride film (with a thickness of 50 nm), a silicon nitride oxide film (with a thickness of 50 nm), and a silicon oxide film (with a thickness of 50 nm) are stacked as a protective layer over the single crystal semiconductor substrate, and irradiation of hydrogen is performed at an accelerating voltage of 40 kV with a dose of $2 \times 10^{16}$ ions/cm$^2$, so that the embrittlement layer is formed in the single crystal semiconductor substrate. After that, a silicon oxide film (with a thickness of 50 nm) is formed as an insulating layer having a bonding surface over the silicon oxide film, which is a top layer of the protective layer. As another example of forming the embrittlement layer, a silicon oxide film (with a thickness of 100 nm) and a silicon nitride oxide film (with a thickness of 50 nm) are stacked as a protective layer over the single crystal semiconductor substrate, and irradiation of hydrogen is performed at an accelerating voltage of 40 kV with a dose of $2 \times 10^{16}$ ions/cm$^2$, so that the embrittlement layer is formed in the single crystal semiconductor substrate. After that, a silicon oxide film (with a thickness of 50 nm) is formed as an insulating layer having a bonding surface over the silicon nitride oxide film, which is a top layer of the protective layer. Note that the silicon oxynitride film and the silicon nitride oxide film may be formed by a plasma CVD method, and the silicon oxide film may be formed by a CVD method using an organosilane gas.

Alternatively, an insulating layer may be formed between the light transmitting substrate and the single crystal semiconductor substrate. The insulating layer may be formed on either the light transmitting substrate side or the single crystal semiconductor substrate side, or both of the sides. An insulating layer formed on a surface which is to be bonded has a smooth surface and forms a hydrophilic surface. A silicon oxide film can be used as the insulating film. As the silicon oxide film, a silicon oxide film formed by a chemical vapor deposition method using an organosilane gas is preferably used. Alternatively, a silicon oxide film formed by a chemical vapor deposition method using a silane gas can be used.

Examples of organosilane gas which can be used are silicon-containing compounds such as ethyl orthosilicate (TEOS: $Si(OC_2H_5)_4$), trimethylsilane (TMS: $(CH_3)_3SiH$), tetramethylsilane ($Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$). Note that when a silicon oxide layer is formed by a chemical vapor deposition method using organosilane as a source gas, it is preferable to mix a gas which provides oxygen. Oxygen, nitrous oxide, nitrogen dioxide, or the like can be used as the gas which provides oxygen. Further, an inert gas such as argon, helium, nitrogen, or hydrogen may be mixed.

Alternatively, as the insulating layer formed on the surface which is to be bonded, a silicon oxide film formed by a chemical vapor deposition method using silane such as monosilane, disilane, or trisilane as a source gas can be used. In this case also, it is preferable to mix an inert gas, a gas which provides oxygen, or the like. Moreover, the silicon oxide film to serve as an insulating layer bonded to the single crystal semiconductor layer may contain chlorine. Note that in this specification, a chemical vapor deposition method includes a plasma CVD method, a thermal CVD method, and a photo-CVD method in its category.

Alternatively, as the insulating layer formed on the surface which is to be bonded, silicon oxide formed by heat treatment in an oxidizing atmosphere, silicon oxide which grows by reaction of oxygen radicals, chemical oxide formed with an oxidizing chemical solution, or the like can be used. As the insulating layer, an insulating layer having a siloxane (Si—O—Si) bond may be used. Further, the insulating layer may be formed by reaction between the organosilane gas and oxygen radicals or nitrogen radicals.

The surface of the insulating layer, which is to be bonded, is preferably set as follows: arithmetic mean roughness Ra is less than 0.8 nm and root-mean-square roughness Rms is less than 0.9 nm; more preferably, Ra is equal to or less than 0.4 nm and Rms is equal to or less than 0.5 nm; still preferably, Ra is equal to or less than 0.3 nm and Rms is equal to or less than 0.4 nm. For example, Ra is 0.27 nm and Rms is 0.34 nm. In this specification, Ra is arithmetic mean roughness; Rms is root-mean-square roughness; and the measurement area is 2 $\mu m^2$ or 10 $\mu m^2$.

When the light transmitting substrate and the single crystal semiconductor substrate are bonded to each other, a strong bond can be formed by providing an insulating layer which is formed of a silicon oxide film preferably using organosilane as a material on one or both of surfaces which are to be bonded to each other.

Figure 15B:
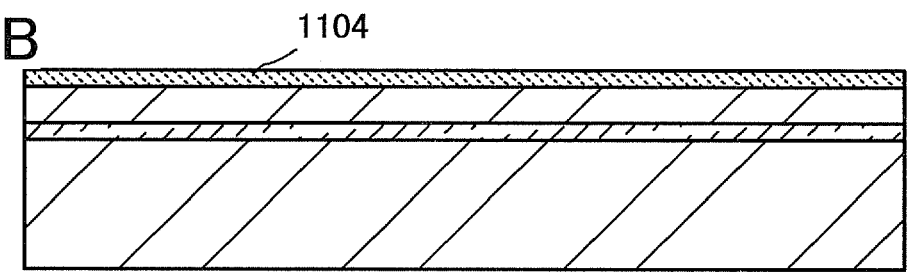

In this embodiment mode, as illustrated in FIG. 15B, a silicon oxide film is formed as an insulating layer 1104 on the surface which is bonded to the light transmitting substrate. As the silicon oxide film, a silicon oxide film formed by a chemical vapor deposition method using an organosilane gas is preferably used. Alternatively, a silicon oxide film formed by a chemical vapor deposition method using a silane gas can be used. In film formation by a chemical vapor deposition method, a film formation temperature of, for example, equal to or less than 350° C. (300° C. as a specific example) is applied as the temperature at which degasification does not occur from the embrittlement layer 1110, which is formed in the single crystal semiconductor substrate. Moreover, heat treatment temperature which is higher than the film formation temperature is applied for heat treatment by which the single crystal semiconductor layer is separated from the single crystal semiconductor substrate.

The light transmitting substrate may be provided with a silicon nitride film or a silicon nitride oxide film which prevents diffusion of an impurity element as a blocking layer (also referred to as a barrier layer). Further, a silicon oxynitride film may be combined as an insulating film having a function of relieving stress.

Figure 15C:
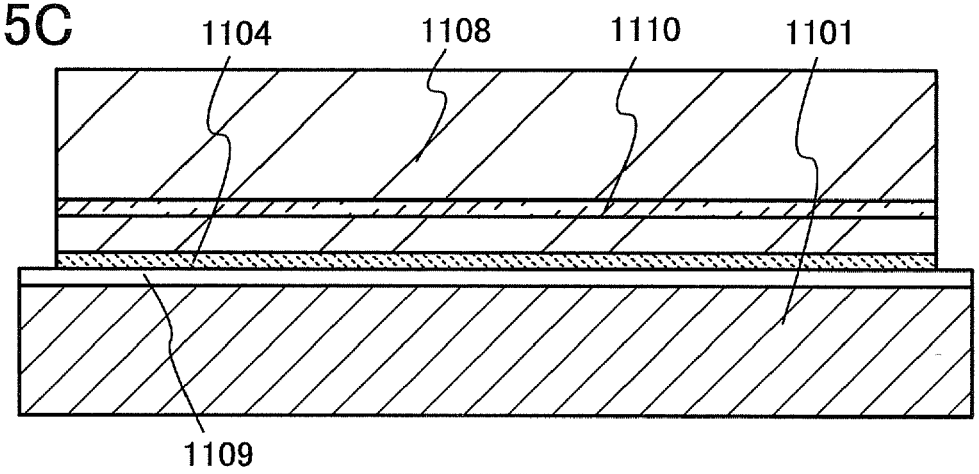

FIG. 15C illustrates a mode in which a blocking layer 1109 provided over a light transmitting substrate 1101 and a surface of the single crystal semiconductor substrate 1108, on which the insulating layer 1104 is formed, are disposed in close contact with each other and bonded to each other. The surfaces which are to be bonded to each other are cleaned sufficiently. The surface of the blocking layer 1109 provided over the light transmitting substrate 1101 and the surface of the single crystal semiconductor substrate 1108, on which the insulating layer 1104 is formed, may be cleaned by megasonic cleaning or the like. Further, the surfaces may be cleaned with ozone water after megasonic cleaning, so that an organic substance can be removed and the hydrophilicity of the surfaces can be improved.

By making the blocking layer 1109 over the light transmitting substrate 1101 and the insulating layer 1104 face each other and pressing one part thereof from the outside, the blocking layer 1109 and the insulating layer 1104 attract each other by increase in van der Waals forces or influence of hydrogen bonding due to local reduction in distance between the bonding surfaces. Further, since the distance between the blocking layer 1109 over the light transmitting substrate 1101 and the insulating layer 1104 which also face each other in an adjacent region is reduced, a region in which van der Waals forces strongly act or a region which is influenced by hydrogen bonding is widened. Accordingly, bonding proceeds and spreads to the entire bonding surfaces.

When the blocking layer 1109 and the insulating layer 1104 are pressed against each other so that one of the four corners of the substrate is suppressed at a pressure of 100 kPa to 5000 kPa, the bonding surfaces come close to each other; thus, the bonding can shift from Van der Waals force to hydrogen bonding. When the bonding surfaces at the one place comes close in the substrate, the adjacent bonding surfaces also come close and shift to hydrogen bonding; thus, the entire bonding surfaces can shift to hydrogen bonding.

In order to form a favorable bond, the surface may be activated. For example, the surface which is to be bonded is irradiated with an atomic beam or an ion beam. When an atomic beam or an ion beam is used, an inert gas neutral atom beam or an inert gas ion beam of argon or the like can be used. Alternatively, plasma irradiation or radical treatment is performed. Such surface treatment makes it easier to form a bond between different kinds of materials even at a temperature of 200° C. to 400° C.

In addition, in order to increase bonding strength of a bonding interface between the light transmitting substrate and the insulating layer, heat treatment is preferably performed. For example, heat treatment is performed under a temperature condition of 70° C. to 350° C. (e.g., at 200° C. for 2 hours) in an oven, a furnace, or the like.

Figure 15D:
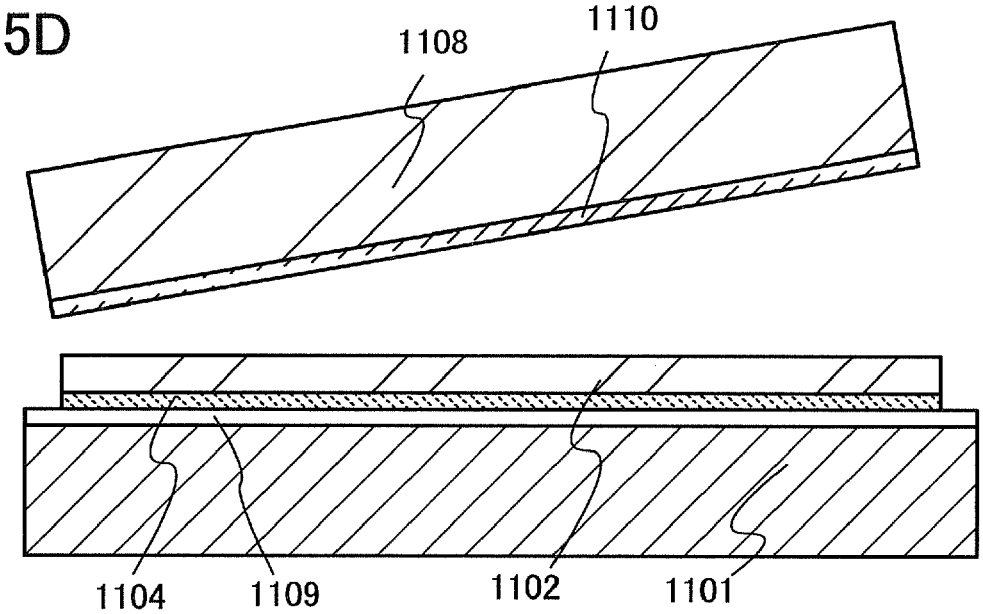

In FIG. 15D, after the light transmitting substrate 1101 and the single crystal semiconductor substrate 1108 are attached to each other, heat treatment is performed, and the single crystal semiconductor substrate 1108 is separated from the light transmitting substrate 1101 using the embrittlement layer 1110 as a cleavage plane. When heat treatment is performed at, for example, 400° C. to 700° C., the volume of the microvoids formed in the embrittlement layer 1110 is changed, which enables cleavage along the embrittlement layer 1110. Since the insulating layer 1104 is bonded to the light transmitting substrate 1101 with the blocking layer 1109 interposed therebetween, a single crystal semiconductor layer 1102 having the same crystallinity as the single crystal semiconductor substrate 1108 remains over the light transmitting substrate 1101.

Heat treatment in a temperature range of 400° C. to 700° C. may be continuously performed with the same device as the above heat treatment for increasing bonding strength or with another device. For example, after heat treatment in a furnace at 200° C. for 2 hours, the temperature is increased to near 600° C. and held for 2 hours; the temperature is decreased to a temperature rang from 400° C. to room temperature; and then the substrate is taken out of the furnace. Alternatively, heat treatment may be performed with the temperature increasing from room temperature. Further, after heat treatment is performed in a furnace at 200° C. for 2 hours, heat treatment may be performed in a temperature range of 600° C. to 700° C. with a rapid thermal annealing (RTA) device for 1 minute to 30 minutes (e.g., at 600° C. for 7 minutes or at 650° C. for 7 minutes).

By heat treatment in a temperature range of 400° C. to 700° C., bonding between the insulating layer and the light transmitting substrate shifts from hydrogen bonding to covalent bonding, and an element added to the embrittlement layer expands and the pressure rises, whereby the single crystal semiconductor layer can be separated from the single crystal semiconductor substrate. After the heat treatment, the light transmitting substrate and the single crystal semiconductor substrate are in a state where one of the light transmitting substrate and the single crystal semiconductor substrate is provided over the other, and the light transmitting substrate and the single crystal semiconductor substrate can be separated from each other without application of large force. For example, one substrate located over the other substrate is lifted by a vacuum chuck, so that the substrate can be easily separated. At this time, if the substrate on a lower side is fixed with a vacuum chuck or a mechanical chuck, the light transmitting substrate and the single crystal semiconductor substrate can be separated from each other without horizontal misalignment.

Note that FIGS. 15A to 15D and FIGS. 16A to 16C illustrate an example in which the single crystal semiconductor substrate 1108 is smaller than the light transmitting substrate 1101; however, the structure is not limited thereto, and the single crystal semiconductor substrate 1108 and the light transmitting substrate 1101 may have the same size or the single crystal semiconductor substrate 1108 may be larger than the light transmitting substrate 1101.

Figure 16A:
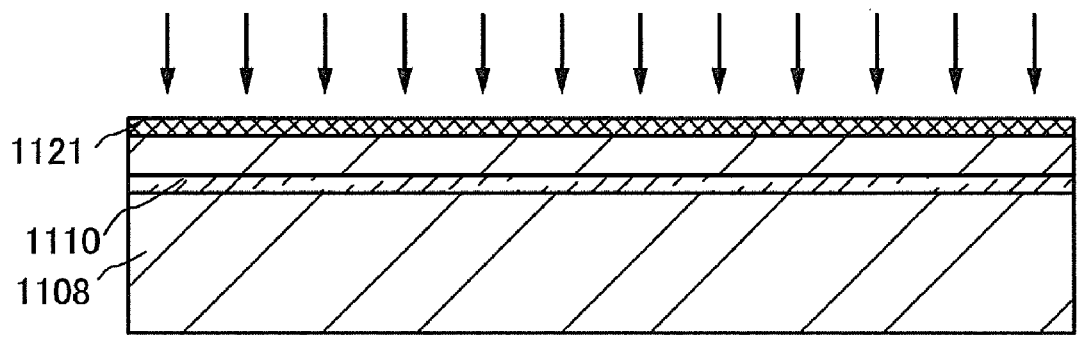
FIGS. 16A to 16C illustrate a method for manufacturing a semiconductor device.
Figure 16B:
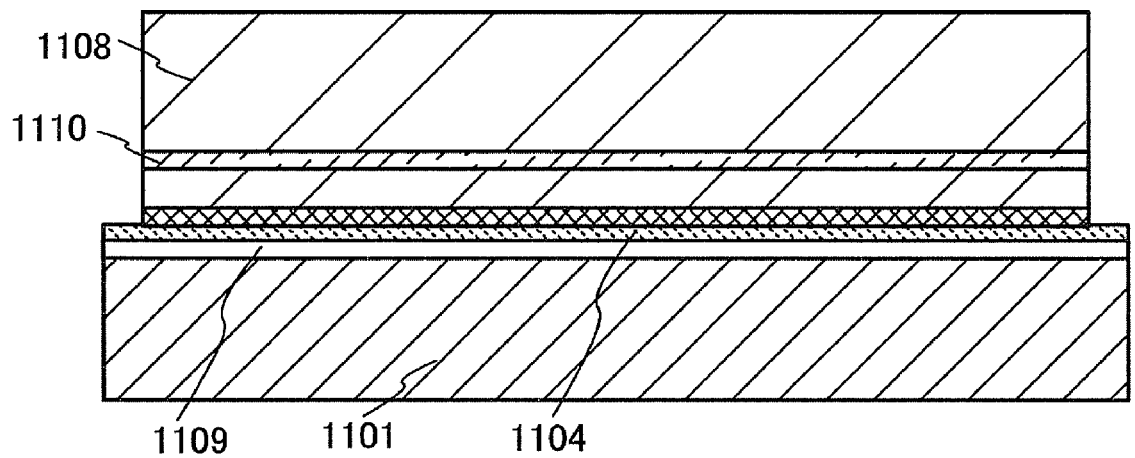
Figure 16C:
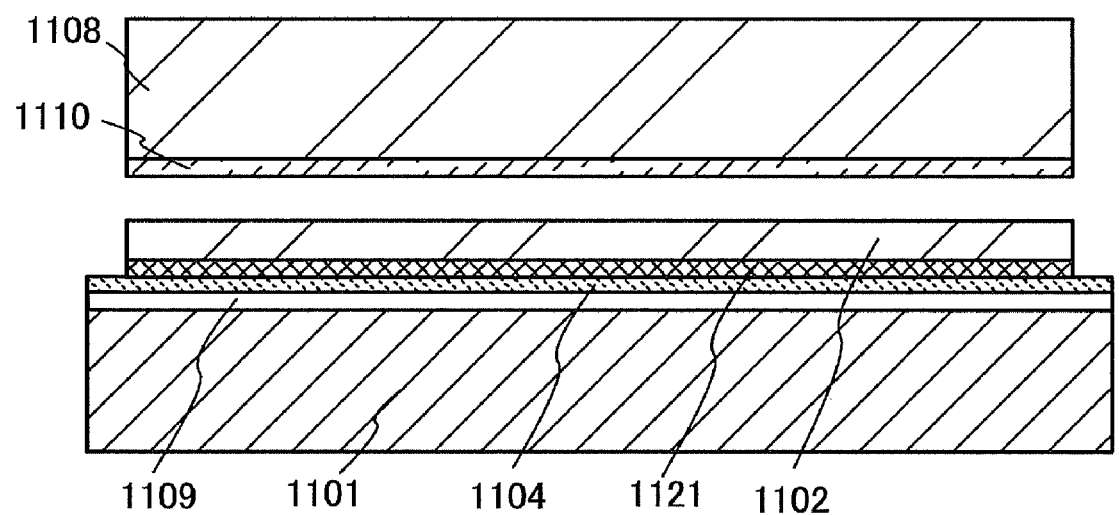

FIGS. 16A to 16C illustrate steps in which an insulating layer is provided on the light transmitting substrate side and a single crystal semiconductor layer is formed. FIG. 16A illustrates a step in which irradiation of ions accelerated by an electric field is performed to reach a predetermined depth of the single crystal semiconductor substrate 1108 provided with a silicon oxide film as a protective layer 1121 to form the embrittlement layer 1110. Ion irradiation is performed in a manner similar to that in the case of FIG. 15A. By forming the protective layer 1121 on the surface of the single crystal semiconductor substrate 1108, the surface can be prevented from being damaged by ion irradiation and losing the planarity. Moreover, the protective layer 1121 has an advantageous effect of preventing diffusion of impurities into the single crystal semiconductor layer 1102 formed from the single crystal semiconductor substrate 1108.

FIG. 16B illustrates a step in which the light transmitting substrate 1101 provided with the blocking layer 1109 and the insulating layer 1104 is disposed in close contact with the surface of the single crystal semiconductor substrate 1108, on which the protective layer 1121 is formed, to form a bond. The bond is formed by disposing the insulating layer 1104 over the light transmitting substrate 1101 in close contact with the protective layer 1121 over the single crystal semiconductor substrate 1108.

After that, the single crystal semiconductor substrate 1108 is separated as illustrated in FIG. 16C. Heat treatment for separating a single crystal semiconductor layer is performed in a manner similar to that in the case of FIG. 15D. In such a manner, a semiconductor substrate having an SOI structure which includes the single crystal semiconductor layer with the insulating layer interposed therebetween as illustrated in FIG. 16C can be obtained.

In some cases, the single crystal semiconductor layer which is separated from the semiconductor substrate and transferred to the light transmitting substrate has crystal defects due to the separation step and the ion implantation step, whereby loses surface planarity, and has unevenness. When a transistor is formed as a semiconductor element using the single crystal semiconductor layer, it is difficult to form a thin gate insulating layer with high withstand voltage on the surface of the single crystal semiconductor layer having such unevenness. Moreover, if the single crystal semiconductor layer has crystal defects, performance and reliability of the transistor are adversely affected; for example, a localized interface state density with the gate insulating layer is increased.

Accordingly, the single crystal semiconductor layer is preferably irradiated with electromagnetic waves such as laser light to reduce crystal defects. At least part of the single crystal semiconductor layer is melted by irradiation with electromagnetic waves such as laser light, whereby crystal defects in the single crystal semiconductor layer can be reduced. Note that an oxide film (a native oxide film or a chemical oxide film) formed on the surface of the single crystal semiconductor layer may be removed by dilute hydrofluoric acid before irradiation with the electromagnetic waves.

Any electromagnetic wave may be used as long as it provides high energy to the single crystal semiconductor layer, and laser light can be preferably used.

Alternatively, the energy can be supplied mainly by heat conduction which is caused by colliding the particles having high energy with the single crystal semiconductor layer by irradiation or the like. As a heat source for supplying the particles having high energy, plasma such as atmospheric-pressure plasma, high-pressure plasma, or a thermal plasma jet, a flame of a gas burner, or the like can be used. Alternatively, an electron beam or the like can be used.

A wavelength of the electromagnetic wave is set so that it is absorbed by the single crystal semiconductor layer. The wavelength can be determined by considering the skin depth of the electromagnetic wave or the like. For example, the wavelength of the electromagnetic wave can be 190 nm to 600 nm. Moreover, the electromagnetic wave energy can be determined by considering the wavelength of the electromagnetic wave, the skin depth of the electromagnetic wave, the thickness of the single crystal semiconductor layer to be irradiated, or the like.

A laser emitting laser light can be a continuous wave laser, a pseudo continuous wave laser, or a pulsed laser. A pulsed laser is preferably used for partial melting. For example, an excimer laser such as a KrF laser, or a gas laser such as an Ar laser or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, and the like can be used. Note that an excimer laser is a pulsed laser, and some solid-state lasers such as a YAG laser can be used as a continuous wave laser, a pseudo continuous wave laser, and a pulsed laser. In addition, in a solid-state laser, the second to fifth harmonics of a fundamental wave can be preferably used. Moreover, a semiconductor laser such as GaN, GaAs, GaAlAs, or InGaAsP can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high-pressure sodium lamp, or a high-pressure mercury lamp may be used. A flash annealing with the use of the above lamp light may be used. Since flash annealing which is performed by preferably using a halogen lamp, a xenon lamp, or the like takes very short treatment time, heating up of the light transmitting substrate can be suppressed.

A shutter, a reflector such as a mirror or a half mirror, an optical system including a cylindrical lens, a convex lens, or the like may be provided in order to adjust the shape or the path of electromagnetic waves.

Note that for irradiation with electromagnetic waves, an electromagnetic wave may be selectively emitted, or light (an electromagnetic wave) can be emitted by scanning the light (the electromagnetic wave) in the X-Y directions. In this case, a polygon mirror or a galvanometer mirror is preferably used in the optical system.

Irradiation with electromagnetic waves can be performed in an atmosphere which contains oxygen, such as an atmospheric atmosphere, or in an inert atmosphere such as a nitrogen atmosphere. In order to perform irradiation with electromagnetic waves in an inert atmosphere, irradiation with electromagnetic waves may be performed in an airtight chamber, and an atmosphere in this chamber may be controlled. When a chamber is not used, a nitrogen atmosphere can be formed by spraying an inert gas such as a nitrogen gas on a surface to be irradiated with electromagnetic waves.

Further, polishing treatment may be performed on the surface of the single crystal semiconductor layer to which high energy is supplied by electromagnetic wave irradiation or the like to reduce crystal defects. Polishing treatment can enhance the planarity of the surface of the single crystal semiconductor layer.

For the polishing treatment, a chemical mechanical polishing (CMP) method or a liquid jet polishing method can be used. Note that the surface of the single crystal semiconductor layer is cleaned and purified before the polishing treatment. The cleaning may be performed by megasonic cleaning, two-fluid jet cleaning, or the like; and dust or the like on the surface of the single crystal semiconductor layer is removed by the cleaning. Moreover, it is preferable to remove a native oxide film or the like on the surface of the single crystal semiconductor layer by using a dilute hydrofluoric acid to expose the single crystal semiconductor layer.

In addition, polishing treatment (or etching treatment) may be performed on the surface of the single crystal semiconductor layer before irradiation with electromagnetic waves.

When a single crystal semiconductor layer is transferred from a single crystal semiconductor substrate, the single crystal semiconductor substrate is selectively etched, and a plurality of single crystal semiconductor layers of which shapes are processed may be transferred to a light transmitting substrate. A plurality of island-shaped single crystal semiconductor layers can be formed over the light transmitting substrate. The single crystal semiconductor substrate of which shapes are processed in advance are transferred; therefore, the size and shape of the single crystal semiconductor substrate are not limited. Accordingly, the single crystal semiconductor layers can be more efficiently transferred to a large-sized light transmitting substrate.

Further, the single crystal semiconductor layer which is bonded over the light transmitting substrate is etched so that the shape of the single crystal semiconductor layer may be processed, modified, and controlled precisely. Accordingly, the single crystal semiconductor layer can be processed into the shape of a semiconductor element, and error in a formation position and a defect in the shape of the single crystal semiconductor layer due to pattern misalignment caused by light in light exposure for forming a resist mask going around the resist mask, positional misalignment caused by a bonding step in transferring the single crystal semiconductor layer, or the like can be modified.

Accordingly, a plurality of single crystal semiconductor layers having a desired shape can be formed over the light transmitting substrate with a high yield. Accordingly, a semiconductor device, which includes a semiconductor element and an integrated circuit that have more precise and high performance, can be manufactured over a large-sized substrate with high throughput and high productivity.

Bonding to the light transmitting substrate may be performed after the single crystal semiconductor layer is separated from the single crystal semiconductor substrate. The surface of the single crystal semiconductor layer which is exposed by cleavage may face to the light transmitting substrate to bond or may be bonded to the light transmitting substrate so as to in contact with the gate insulating film.

In this embodiment mode, when a single crystal silicon substrate is used as the single crystal semiconductor substrate 1108, a single crystal silicon layer can be obtained as the single crystal semiconductor layer 1102. Further, since a method for manufacturing a semiconductor device in this embodiment mode allows the process temperature to be 700° C. or lower, a glass substrate can be used as the light transmitting substrate 1101. That is, a transistor can be formed over a glass substrate in a manner similar to that of a conventional thin film transistor, and a single crystal silicon layer can be used for the semiconductor layer. Accordingly, it is possible to form a transistor with high performance and high reliability, which can operate at high speed, has a low sub-threshold value and high field effect mobility, and can be driven with low voltage consumption, over a light transmitting substrate such as a glass substrate.

This embodiment mode can be combined with Embodiment Mode 1 as appropriate.

Embodiment Mode 3

This embodiment mode describes an example of steps of bonding a single crystal semiconductor layer from a single crystal semiconductor substrate to a light transmitting substrate, which are different from those in Embodiment Mode 2. Accordingly, description of the same portion or a portion having a similar function to the portions in Embodiment Mode 2 is not repeated.

First, processing on the single crystal substrate side is described. In this embodiment mode, a single crystal semiconductor substrate is degreased and cleaned to remove an oxide film on the surface, and thermal oxidation is performed. As thermal oxidation, oxidation in an oxidizing atmosphere to which halogen is added is preferably performed. For example, heat treatment is performed at a temperature of equal to or greater than 700° C. in an atmosphere containing HCl at 0.5 to 10 volume % (preferably 3 volume %) with respect to oxygen. Thermal oxidation is preferably performed at a temperature of 950° C. to 1100° C. The processing time may be 0.1 to 6 hours, preferably 0.5 to 3.5 hours. The thickness of the oxide film to be formed is 10 nm to 1000 nm (preferably 50 nm to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by action of chlorine and removed. The heat treatment has an advantageous effect on the case where the surface of the single crystal semiconductor substrate is subjected to chemical mechanical polishing (CMP). Hydrogen has an effect of compensating a defect at the interface between the single crystal semiconductor substrate and an insulating layer to be formed over a light transmitting substrate so as to reduce local level density at the interface, and the interface between the single crystal semiconductor substrate and the insulating layer is inactivated to stabilize electric characteristics.

Halogen can be contained in the oxide film formed by this heat treatment. A halogen element is contained at a concentration of $1\times10^{17}$ atoms/cm$^3$ to $5\times10^{20}$ atoms/cm$^3$, whereby the oxide film can function as a protective layer which captures impurities such as metal to prevent contamination of the single crystal semiconductor substrate.

Ions are introduced into the single crystal semiconductor substrate to form an embrittlement layer. The depth of a region where the embrittlement layer is formed can be adjusted by the acceleration energy of the ions to be introduced and the angle at which the ions enter. The acceleration energy can be adjusted by acceleration voltage or the like.

As a gas used in ion introduction, a hydrogen gas, a rare gas, or the like is used. In this embodiment mode, a hydrogen gas is preferably used. When a hydrogen gas is used in an ion doping method, generated ion species are $H^+$, $H_2^+$, and $H_3^+$, and it is preferable that $H_3^+$ be the largest number of ions introduced to the single crystal semiconductor substrate. $H_3^+$ has higher introduction efficiency than $H^+$ or $H_2^+$, so that introduction time can be reduced. Moreover, a crack is easily generated in the embrittlement layer in a later step.

Next, processing on the light transmitting substrate side is described. First, a surface of the light transmitting substrate is cleaned. For cleaning, ultrasonic cleaning may be performed with a hydrochloric acid/hydrogen peroxide mixture (HPM), a sulfuric acid/hydrogen peroxide mixture (SPM), an ammonia peroxide mixture (APM), diluted hydrogen fluoride (DHF), or the like. In this embodiment mode, ultrasonic cleaning is performed with a hydrochloric acid/hydrogen peroxide mixture.

Then, planarization treatment by plasma treatment is performed on the light transmitting substrate from which impurities such as dust on the surface are removed by cleaning. In this embodiment mode, plasma treatment is performed in such a manner that an inert gas such as an argon (Ar) gas is used in a vacuum chamber and bias voltage is applied to the light transmitting substrate to be processed to generate plasma. An oxygen ($O_2$) gas or a nitrogen ($N_2$) gas may be introduced together with the inert gas.

The light transmitting substrate is set to be in the cathode direction, and positive ions of Ar in the plasma are accelerated in the cathode direction to collide with the light transmitting substrate. By collision of the Ar positive ions, the surface of the light transmitting substrate is sputter-etched. Accordingly, a projection on the surface of the light transmitting substrate is etched, so that the surface of the light transmitting substrate can be planarized. A reactive gas has an advantageous effect of repairing defects caused by sputter etching of the surface of the light transmitting substrate.

Next, an insulating layer is formed over the light transmitting substrate. In this embodiment mode, an oxide film containing aluminum oxide as its main component, which is other than a silicon-based insulating layer, is used. The oxide film containing aluminum oxide as its main component refers to an oxide film in which aluminum oxide is contained at least 10 wt. % where the total amount of all components in the oxide film is 100 wt. %. Alternatively, as the insulating layer, a film which contains aluminum oxide as its main component and also contains one or both of magnesium oxide and strontium oxide can be used. Moreover, aluminum oxide containing nitrogen may be used.

The insulating layer can be formed by a sputtering method. As a target used in a sputtering method, metal including aluminum or metal oxide such as aluminum oxide can be used, for example. Note that a material of the target may be selected as appropriate depending on the film to be formed.

When metal is used as the target, the insulating layer is formed in such a manner that sputtering is performed while a reactive gas (e.g. oxygen) is introduced (by a reactive sputtering method). As the metal, magnesium (Mg); an alloy containing aluminum and magnesium; an alloy containing aluminum and strontium (Sr); or an alloy containing aluminum, magnesium, and strontium can be used other than aluminum. In this case, sputtering may be performed using a direct-current (DC) power supply or a radio frequency (RF) power supply.

When metal oxide is used as the target, the insulating layer is formed by sputtering with a radio frequency (RF) power supply (by an RF sputtering method). As the metal oxide, magnesium oxide; strontium oxide; oxide containing aluminum and magnesium; oxide containing aluminum and strontium; or oxide containing aluminum, magnesium, and strontium can be used other than aluminum oxide.

Alternatively, the insulating layer may be formed by a bias sputtering method. When a bias sputtering method is used, a film can be deposited while a surface of the film can be planarized.

The oxide film containing aluminum as its main component can prevent impurities such as moisture and mobile ions included in the light transmitting substrate from diffusing into a single crystal semiconductor layer to be formed over the light transmitting substrate later.

Next, the surface of the single crystal semiconductor substrate and the surface of the light transmitting substrate are made to face each other, and the single crystal semiconductor substrate and the insulating layer are bonded to each other. The single crystal semiconductor substrate and a surface of the insulating layer formed over the light transmitting substrate are disposed in close contact with each other, so that a bond is formed.

Note that before the single crystal semiconductor substrate and the light transmitting substrate are bonded to each other, surface treatment is preferably performed on the insulating layer formed over the light transmitting substrate.

Then, as in Embodiment Mode 2, heat treatment is performed to carry out separation (cleavage) at the embrittlement layer, whereby a single crystal semiconductor layer can be formed over the light transmitting substrate with the insulating layer interposed therebetween.

A semiconductor element layer can be formed using the single crystal semiconductor layer provided over the light transmitting substrate.

Next, steps of repeatedly using a separated single crystal semiconductor substrate (process for reprocessing a semiconductor substrate) are described.

First, a separated single crystal semiconductor substrate is taken out. In some cases, an end portion of the single crystal semiconductor substrate is not sufficiently bonded to the light transmitting substrate due to edge roll-off. Thus, in some cases, the end portion of the single crystal semiconductor substrate is not separated at the embrittlement layer, and the insulating layer or the like remains.

A residue on the end portion of the single crystal semiconductor substrate is removed. The residue can be removed by wet etching treatment. Specifically, wet etching is performed using a mixture solution containing hydrofluoric acid, ammonium fluoride, and surfactant (e.g., product name: LAL500, made by Stella Chemifa Corporation) as an etchant.

Moreover, the embrittlement layer into which hydrogen ions are introduced can be removed by wet etching using an organic alkaline aqueous solution typified by tetramethylammonium hydroxide (TMAH). By performing such treatment, a step due to the residue on the end portion of the single crystal semiconductor substrate is reduced.

Next, the single crystal semiconductor substrate is oxidized in a halogen atmosphere to form an oxide film, and after that, the oxide film is removed. Hydrogen chloride (HCl) can be used as the halogen. Accordingly, a gettering effect by a halogen element can be obtained. Gettering particularly has an effect of removing metal impurities. That is, impurities such as metal change into volatile chloride and are released into air by action of chlorine and removed.

Then, CMP process is performed on the single crystal semiconductor substrate as polishing treatment. Thus, the step in the end portion of the single crystal semiconductor substrate is removed, and the surface of the single crystal semiconductor substrate can be planarized. After that, the obtained single crystal semiconductor substrate is used again as a base wafer.

As described in this embodiment mode, by repeatedly using a single crystal semiconductor substrate through the steps of reprocessing a single crystal semiconductor substrate, reduction in cost can be realized. Moreover, by using the steps of reprocessing a single crystal semiconductor substrate described in this embodiment mode, a surface of the single crystal semiconductor substrate can be sufficiently planarized even when the single crystal semiconductor substrate is repeatedly used. Accordingly, the adhesion between the single crystal semiconductor substrate and the light transmitting substrate can be increased, and bonding defects can be reduced.

This embodiment mode can be combined with Embodiment Mode 1 and Embodiment Mode 2 as appropriate.

Embodiment Mode 4

In this embodiment mode, various examples of electronic devices which include a sensor obtained by the invention disclosed in this specification are described. Electronic devices to which the invention disclosed in this specification is applied include a computer, a display, a mobile phone, a television device, and the like. Specific examples of those electronic devices are illustrated in FIGS. 10A to 10C, FIGS. 11A and 11B, FIG. 12, FIGS. 13A and 13B, and FIG. 14.

Figure 10A:
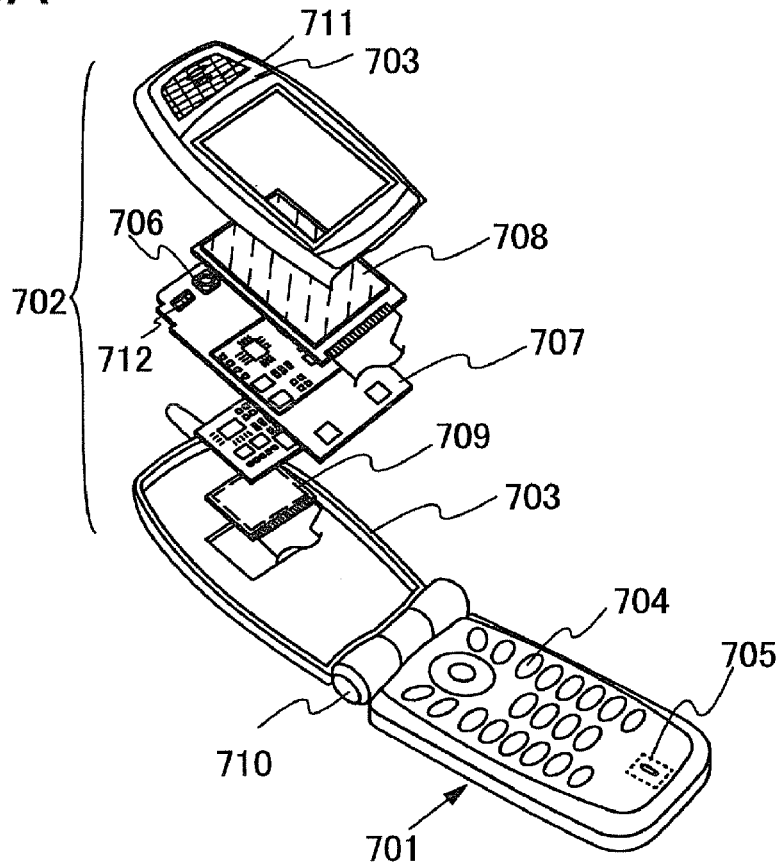
FIGS. 10A to 10C each illustrates a device on which a semiconductor device is mounted.
Figure 10B:
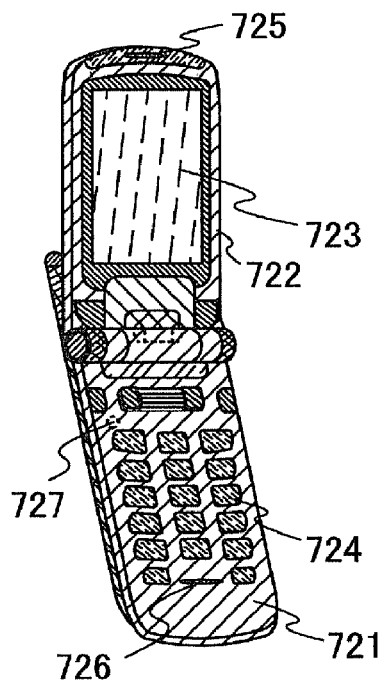
Figure 10C:
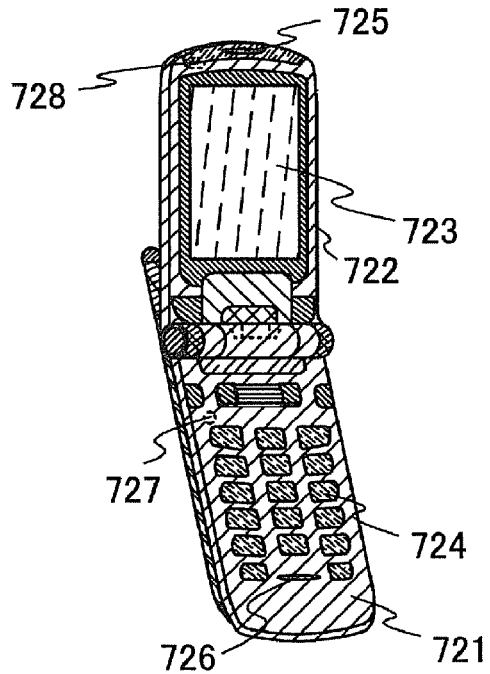

FIGS. 10A to 10C illustrate mobile phones and the mobile phone in FIG. 10A includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711, and a sensor 712.

The sensor 712 detects the light which pass through the light-transmitting material portion 711, and the luminance of the display panel (A) 708 and the display panel (B) 709 are controlled based on the illuminance of external light that is detected, or illumination of the operation keys 704 is controlled based on the illuminance obtained by the sensor 712. Accordingly, current consumption of the mobile phone can be reduced.

FIGS. 10B and 10C illustrate another example of a mobile phone. In FIGS. 10B and 10C, reference numeral 721 denotes the main body, 722 denotes a housing, 723 denotes a display panel, 724 denotes operation keys, 725 denotes an audio output portion, 726 denotes an audio input portion, 727 denotes a sensor, and 728 denotes a sensor.

In the mobile phone illustrated in FIG. 10B, the luminance of the display panel 723 and the operation keys 724 can be controlled by detecting the light from the exterior with the sensor 727 which is provided in the main body 721.

In the mobile phone illustrated in FIG. 10C, the sensor 728 is provided inside the main body 721 in addition to the structure of FIG. 10B. By the sensor 728, the luminance of the backlight which is provided in the display panel 723 also can be detected.

Figure 11A:
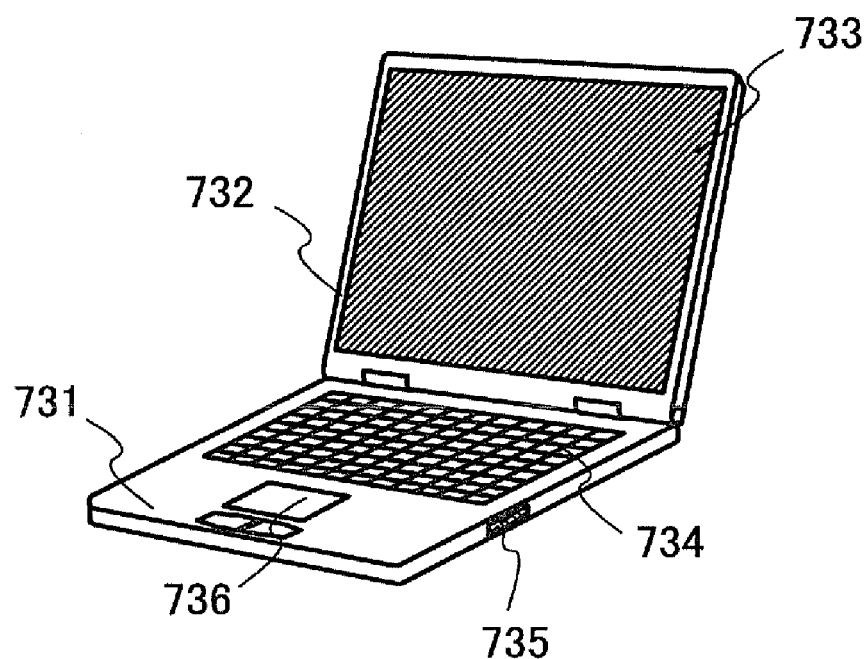
FIGS. 11A and 11B illustrate devices on which a semiconductor device is mounted.

FIG. 11A illustrates a computer including a main body 731, a housing 732, a display portion 733, a keyboard 734, an external connection port 735, a pointing device 736, and the like.

Figure 11B:
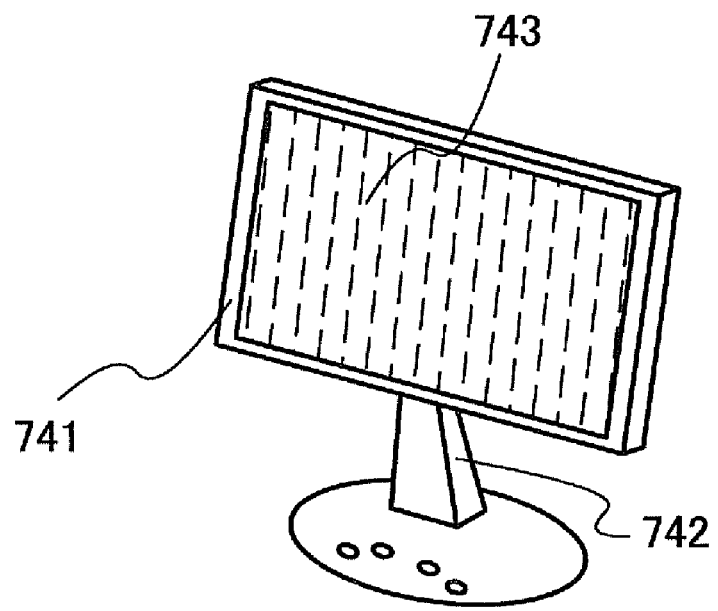

FIG. 11B illustrates a television device which is an example of a display device and includes a housing 741, a supporting base 742, a display portion 743, and the like.

Figure 12:
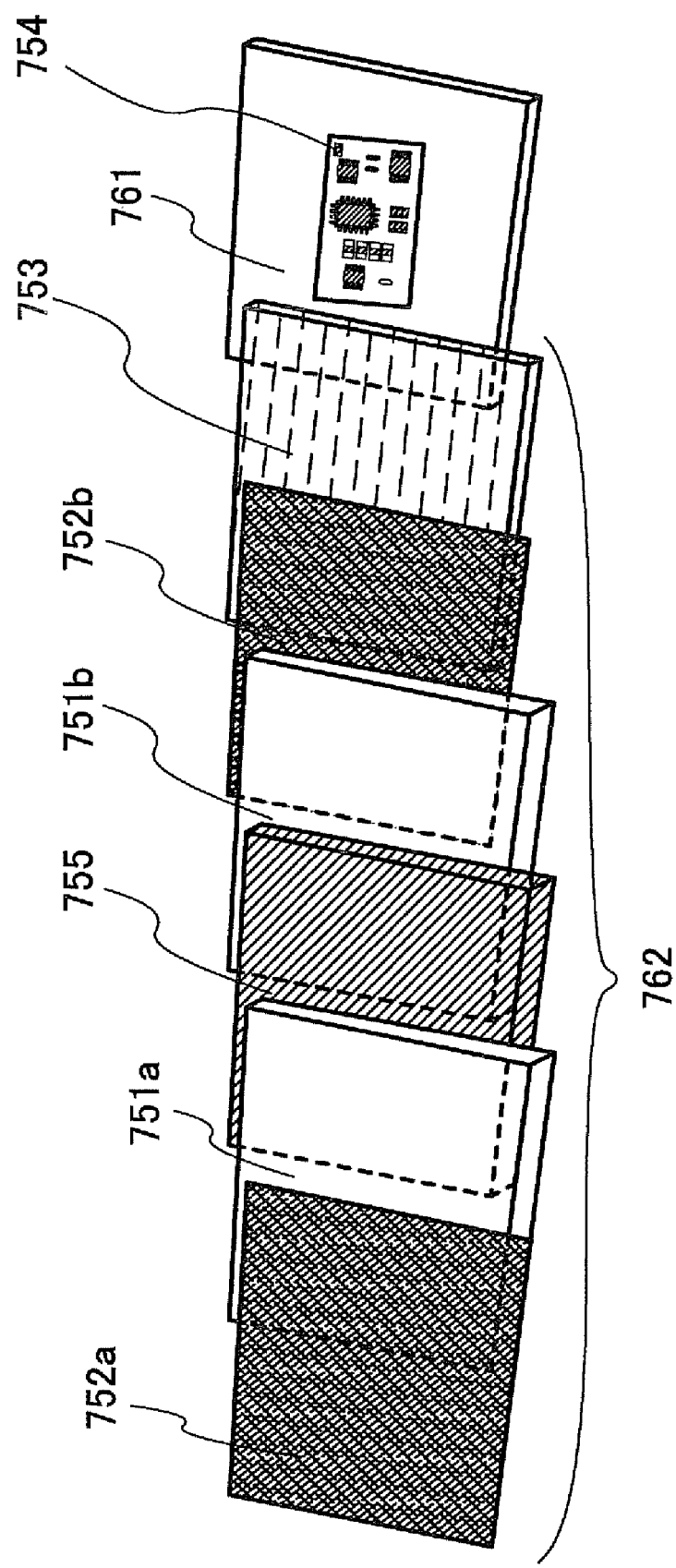
FIG. 12 illustrates a device on which a semiconductor device is mounted.

FIG. 12 illustrates a detailed structure in the case of using a liquid crystal panel as a display portion 733 provided in a computer illustrated in FIG. 11A, and as the display portion 743 of the display device illustrated in FIG. 11B.

A liquid crystal panel 762 illustrated in FIG. 12 is incorporated in a housing 761 and includes substrates 751a and 751b, a liquid crystal layer 755 interposed between the substrates 751a and 751b, polarizing filters 752a and 752b, a backlight 753, and the like. A housing 761 is provided with a sensor 754.

The sensor 754 which is manufactured using the invention disclosed in this specification detects the amount of light from the backlight 753, and the information is fed back for adjusting the luminance of the liquid crystal panel 762.

Figure 13A:
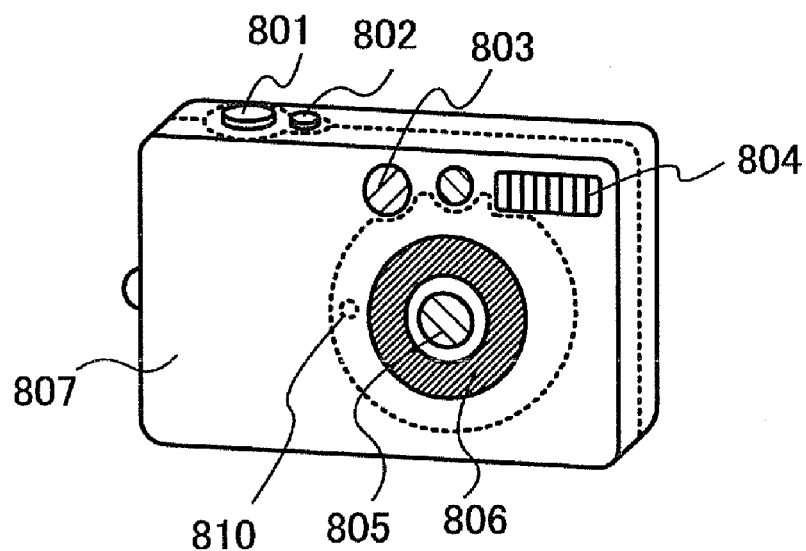
FIGS. 13A and 13B illustrate a device on which a semiconductor device is mounted.
Figure 13B:
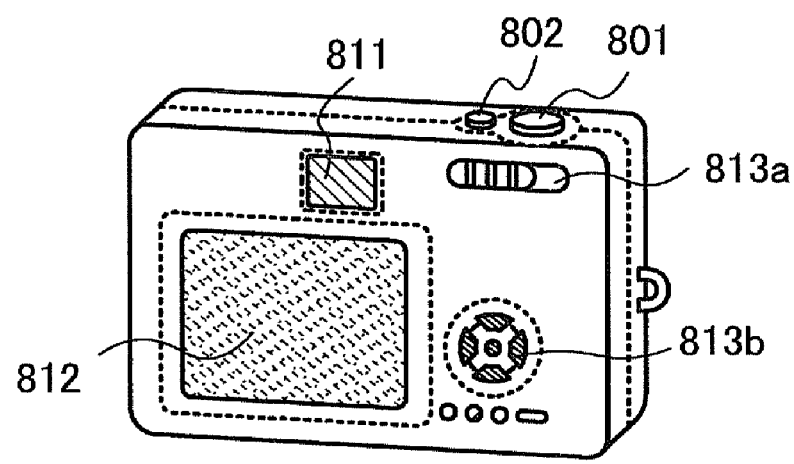

FIGS. 13A and 13B illustrate an example of a camera in which a sensor 810 using the invention disclosed in this specification is included, for example a digital camera. FIG. 13A is a front perspective view seen from the front side of the digital camera, and FIG. 13B is a back perspective view seen from the back side of the digital camera. In FIG. 13A, the digital camera is provided with a release button 801, a main switch 802, a viewfinder 803, a flush portion 804, a lens 805, a lens barrel 806, a housing 807, and the sensor 810.

In addition, in FIG. 13B, a viewfinder eyepiece 811, a monitor 812, and operation buttons 813a and 813b are provided.

When the release button 801 is pressed down halfway, a focusing adjusting mechanism and an exposure adjusting mechanism are operated, and when the release button is pressed down fully, a shutter is opened.

The main switch 802 switches on or off of a power source of a digital camera by being pressed or rotated.

The viewfinder 803 is placed at the upper portion of the lens 805 of a front side of the digital camera, and is a device for recognizing an area which is taken or a focus position from the viewfinder eyepiece 811 illustrated in FIG. 13B.

The flush portion 804 is placed at the upper portion of the front side of the digital camera, and when object luminance is low, supporting light is emitted at the same time as the release button is pressed down so that the shutter is opened.

The lens 805 is placed at the front face of the digital camera. The lens is formed of a focusing lens, a zoom lens, or the like, and forms a photographing optical system with a shutter and aperture that are not illustrated. Note that an image pickup device such as charge coupled device (CCD) is provided at the rear of the lens.

The lens barrel 806 moves a lens position to adjust the focus of the focusing lens, the zoom lens, and the like. At shooting, the lens barrel is slid out to move the lens 805 forward. In addition, when carrying the camera, the lens 805 is moved backward so as to make the camera compact. Note that a structure is employed in this embodiment mode, in which the lens barrel is slid out so that the object can be shot by being zoomed; however, the structure is not limited the structure. Instead, a digital camera may employ a structure in which zoom shooting can be conducted without sliding out the lens barrel by a photographing optical system inside the housing 807.

The viewfinder eyepiece 811 is provided at the upper portion of the rear side of the digital camera, for looking through when checking an area which is taken or a focus point.

The operation buttons 813 are buttons for various functions that are provided at the rear side of the digital camera and include a set up button, a menu button, a display button, a functional button, a selection button and the like.

When the sensor 810 to which the invention disclosed in this specification is applied is incorporated in the camera illustrated in FIGS. 13A and 13B, the sensor 810 can detect the light intensity and whether light exists or not; accordingly, an exposure adjustment or the like of the camera can be performed. Since the sensor disclosed in this specification is thin, the device can be small even when the sensor is mounted on. Miniaturization of a component like the sensor is effective particularly when the component is used for portable electronic devices.

Figure 14:
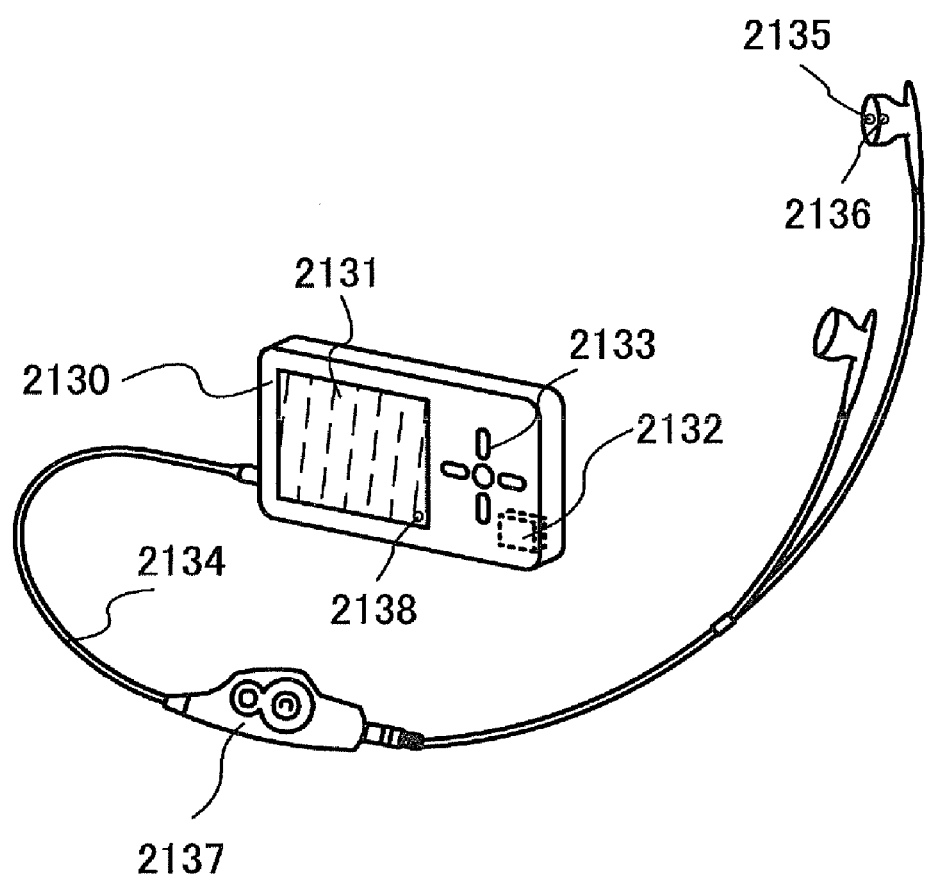
FIG. 14 illustrates a device on which a semiconductor device is mounted.

The invention disclosed in this specification can be applied to a portable information terminal which has a function of sound reproduction. FIG. 14 illustrates a digital player which is one typical example of an audio device. The digital player illustrated in FIG. 14 includes a main body 2130, a display portion 2131, a memory portion 2132, operating portions 2133, a pair of earphones 2134, a sensor 2135, a sensor 2136, a control portion 2137 and the like. Note that a headphone or a wireless earphone can be used instead of the earphones 2134.

Since the sensor 2135 is an optical sensor which detects light, the sensor 2135 is provided in a region where light is blocked in the earphone at wearing the earphone. On the other hand, since the sensor 2136 is a pressure-sensitive sensor, the sensor 2136 is provided in a region where the sensor touches to the ear in the earphone at wearing the earphone. Whether or not the earphone is worn can be detected by the sensor 2135 which detects existence of light, and by the sensor 2136 which detects existence of pressure. The control portion 2137 controls the digital player with the information detected by the sensor 2135 and the sensor 2136 such that the digital player is turned on when the earphone is worn and the digital player is turned off when the earphone is not worn. Thus, even if the operating portions 2133 of the main body 2130 of the digital player is not controlled directly, on or off of the digital player can be switched automatically by whether or not the earphone is worn.

The color sensor disclosed in this specification can be used as the sensor 2138, which can detect light from the outside and can control the luminance of the display portion 2131 based on the illuminance of external light which is detected.

Further, using the memory portion 2132, an image or sound (music) can be recorded and reproduced by controlling the operating portions 2133. Note that when white characters are displayed on a black background in the display portion 2131, power consumption can be suppressed. Note that a memory device which is provided in the memory portion 2132 may be removable.

The semiconductor device of the invention disclosed in this specification can also be applied to other electronic devices such as a projection TV and a navigation system, for example. In other words, the semiconductor device can be applied to anything that is necessary to detect light.

This embodiment mode can be combined with Embodiment Mode 1 to Embodiment Mode 3 as appropriate.

This application is based on Japanese Patent Application serial No. 2008-022550 filed with Japan Patent Office on Feb. 1, 2008, the entire contents of which are hereby incorporated by reference.

What is claimed is:

1. A semiconductor device comprising:
   first and second semiconductor integrated circuits mounted on an interposer, each of the first and second semiconductor integrated circuits comprising:
   a light transmitting substrate having an upside-down T block shape in a cross-section;
   a semiconductor element layer including a photoelectric conversion element provided on a first surface of the light transmitting substrate; and
   a chromatic color light transmitting resin layer which covers a second surface of the light transmitting substrate and a part of a side surface of the light transmitting substrate,
   wherein the chromatic color light transmitting resin layer of the first semiconductor integrated circuit and the chromatic color light transmitting resin layer of the second semiconductor integrated circuit include different coloring materials.

2. The semiconductor device according to claim 1, wherein colors of light which transmit the chromatic color light transmitting resin layer are any two of red, green and blue.

3. The semiconductor device according to claim 1, wherein the first and second semiconductor integrated circuits are mounted on the interposer with a solder.

4. The semiconductor device according to claim 1, wherein the first and second semiconductor integrated circuits are fixed to the interposer with resin.

5. The semiconductor device according to claim 1, wherein a light transmitting resin layer is stacked over each of the chromatic color light transmitting resin layers.

6. The semiconductor device according to claim 5, wherein a thickness of the light transmitting resin layer is larger than a thickness of the chromatic color light transmitting resin layers.

7. The semiconductor device according to claim 1, wherein the side surface of the light transmitting substrate in contact with one of the chromatic color light transmitting resin layers is a curved surface.

8. The semiconductor device according to claim 1, wherein a lower surface of the light transmitting substrate and an upper surface of the light transmitting substrate are quadrangles.

9. The semiconductor device according to claim 1, wherein each of the first and second semiconductor integrated circuits includes an amplifier circuit for amplifying an output of the photoelectric conversion element.

10. The semiconductor device according to claim 1, wherein the photoelectric conversion element includes a stacked layer structure formed of a p-type semiconductor layer, an i-type semiconductor layer, and an n-type semiconductor layer.

11. The semiconductor device according to claim 1, wherein the light transmitting substrate is a glass substrate.

12. The semiconductor device according to claim 1, wherein colors of light which transmit the chromatic color light transmitting resin layer are any two of cyan, magenta and yellow.

13. A semiconductor device comprising:
  first and second semiconductor integrated circuits mounted on an interposer, each of the first and second semiconductor integrated circuits comprising:
    a light transmitting substrate having a stepped trapezoid shape in a cross-section;
    a semiconductor element layer including a photoelectric conversion element provided on a first surface of the light transmitting substrate; and
    a chromatic color light transmitting resin layer which covers a second surface of the light transmitting substrate and a part of a side surface of the light transmitting substrate,
  wherein the chromatic color light transmitting resin layer of the first semiconductor integrated circuit and the chromatic color light transmitting resin layer of the second semiconductor integrated circuit include different coloring materials.

14. The semiconductor device according to claim 13, wherein colors of light which transmit the chromatic color light transmitting resin layer are any two of red, green and blue.

15. The semiconductor device according to claim 13, wherein the first and second semiconductor integrated circuits are mounted on the interposer with a solder.

16. The semiconductor device according to claim 13, wherein the first and second semiconductor integrated circuits are fixed to the interposer with resin.

17. The semiconductor device according to claim 13, wherein a light transmitting resin layer is stacked over each of the chromatic color light transmitting resin layers.

18. The semiconductor device according to claim 17, wherein a thickness of the light transmitting resin layer is larger than a thickness of the chromatic color light transmitting resin layers.

19. The semiconductor device according to claim 13, wherein the side surface of the light transmitting substrate in contact with one of the chromatic color light transmitting resin layers is a curved surface.

20. The semiconductor device according to claim 13, wherein a lower surface of the light transmitting substrate and an upper surface of the light transmitting substrate are quadrangles.

21. The semiconductor device according to claim 13, wherein each of the first and second semiconductor integrated circuits includes an amplifier circuit for amplifying an output of the photoelectric conversion element.

22. The semiconductor device according to claim 13, wherein the photoelectric conversion element includes a stacked layer structure formed of a p-type semiconductor layer, an i-type semiconductor layer, and an n-type semiconductor layer.

23. The semiconductor device according to claim 13, wherein the light transmitting substrate is a glass substrate.

24. The semiconductor device according to claim 13, wherein colors of light which transmit the chromatic color light transmitting resin layer are any two of cyan, magenta and yellow.

* * * * *